(12) United States Patent
Whiteman

(10) Patent No.: US 12,471,409 B2
(45) Date of Patent: Nov. 11, 2025

(54) MONOLITHIC ELECTRONIC DEVICE

(71) Applicant: PLESSEY SEMICONDUCTORS LIMITED, Plymouth (GB)

(72) Inventor: John Whiteman, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 634 days.

(21) Appl. No.: 17/801,100

(22) PCT Filed: Mar. 25, 2021

(86) PCT No.: PCT/EP2021/057713
§ 371 (c)(1),
(2) Date: Aug. 19, 2022

(87) PCT Pub. No.: WO2021/198009
PCT Pub. Date: Oct. 7, 2021

(65) Prior Publication Data
US 2023/0075038 A1    Mar. 9, 2023

(30) Foreign Application Priority Data
Mar. 30, 2020   (GB) .................................... 2004610

(51) Int. Cl.
*H01L 21/66* (2006.01)
*G01R 1/04* (2006.01)
(Continued)

(52) U.S. Cl.
CPC .......... *H10H 20/01* (2025.01); *G01R 1/0408* (2013.01); *H10H 20/018* (2025.01);
(Continued)

(58) Field of Classification Search
CPC ...................................................... H01L 22/34
See application file for complete search history.

(56) References Cited

U.S. PATENT DOCUMENTS

| 2004/0084782 | A1 | 5/2004 | Magerlein et al. |
| 2011/0266560 | A1 | 11/2011 | Yao et al. |

(Continued)

FOREIGN PATENT DOCUMENTS

| CN | 106252481 A | 12/2016 |
| KR | 20150032209 A | 3/2015 |

(Continued)

OTHER PUBLICATIONS

International Search Report, PCT/EP2021/057713, dated Jun. 16, 2021, 4 pages.

(Continued)

*Primary Examiner* — Christopher A Johnson
(74) *Attorney, Agent, or Firm* — Stinson LLP

(57) ABSTRACT

A method of forming and testing a plurality of monolithic electronic devices is provided. As part of the method a monolithic device array comprising Group III-nitrides is formed on a sacrificial substrate. A test substrate comprising electrical contacts is aligned with electrical contacts of the monolithic device array and bonded to the monolithic device array via bonding dielectric layers. Power is supplied from the test substrate to test the monolithic devices of the monolithic device array. Portions of the sacrificial substrate are then selectively removed to separate each of the monolithic electronic devices, wherein a sacrificial dielectric layer is removed to separate each monolithic electronic device from the test substrate.

20 Claims, 20 Drawing Sheets

(51) Int. Cl.
  *H10H 20/01* (2025.01)
  *H10H 20/82* (2025.01)
  *H10H 20/825* (2025.01)
  *H10H 20/851* (2025.01)
  *H10H 29/14* (2025.01)

(52) U.S. Cl.
  CPC .......... *H10H 20/82* (2025.01); *H10H 20/825* (2025.01); *H10H 20/851* (2025.01); *H10H 29/142* (2025.01); *H10H 20/0361* (2025.01)

(56) References Cited

U.S. PATENT DOCUMENTS

| | | |
|---|---|---|
| 2012/0074441 A1 | 3/2012 | Seo et al. |
| 2013/0264592 A1 | 10/2013 | Bergmann et al. |
| 2014/0084482 A1 | 3/2014 | Hu et al. |
| 2015/0008389 A1 | 1/2015 | Hu et al. |
| 2015/0124076 A1 | 5/2015 | Hersee |
| 2015/0263066 A1* | 9/2015 | Hu ................ H10H 20/817 438/28 |
| 2016/0197232 A1 | 7/2016 | Bour et al. |
| 2017/0294479 A1 | 10/2017 | Cha et al. |
| 2018/0062040 A1 | 3/2018 | Simin et al. |
| 2018/0114800 A1 | 4/2018 | Pan |
| 2018/0151804 A1 | 5/2018 | Chaji et al. |
| 2018/0158706 A1 | 6/2018 | Hsu et al. |
| 2019/0027452 A1 | 1/2019 | Ku et al. |
| 2019/0276308 A1 | 9/2019 | Hsu et al. |
| 2019/0287949 A1 | 9/2019 | Chong et al. |
| 2020/0220047 A1 | 7/2020 | Lee et al. |

FOREIGN PATENT DOCUMENTS

| | | |
|---|---|---|
| WO | 2015138102 A1 | 9/2015 |
| WO | 2015152817 A1 | 10/2015 |

OTHER PUBLICATIONS

Written Opinion, PCT/EP2021/057713, dated Jun. 16, 2021, 19 pages.
Great Britain Search Report, Application No. GB2004610.8, dated Sep. 14, 2020, 9 pages.
Taiwanese Search Report, Application No. 110110765, dated Mar. 4, 2022, 23 pages.
Great Britain Search Report, Application No. GB2004610.8, dated Apr. 26, 2022, 7 pages.

* cited by examiner

MONOLITHIC ELECTRONIC DEVICE

REFERENCE TO RELATED APPLICATIONS

This application is the 371 U.S. national stage application of International Patent Application No. PCT/EP2021/057713, filed Mar. 25, 20021, which claims the benefit of Great Britain Patent Application No. 2004610.8, filed Mar. 30, 2020, the entire disclosures of which are incorporated herein by reference.

FIELD OF THE DISCLOSURE

The present disclosure relates to Group III-nitride semiconductors. In particular, the present disclosure relates to electronic devices comprising Group III-nitride semiconductors.

BACKGROUND

Micro LEDs are commonly defined as LEDs with a size of 100 µm×100 µm or less. Micro LEDs may be arranged as an array to form a self-emitting micro-display/projector which may be suitable for use in a variety of devices such as smartwatches, head-mounted displays, pico-projectors for AR and VR applications and large area displays.

One known form of a micro LED array comprises a plurality of LEDs formed from Group III-nitrides. Group III-nitride LEDs are inorganic semiconductor LEDs containing GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring, or benefiting from, high brightness.

Known micro LEDs fabrication techniques include the formation of one or more GaN layers on a Sapphire substrate in order to produce LEDs which emit blue or green coloured light. For LEDs which emit red coloured light, known fabrication techniques include the formation of one or more InAlGaP layers on a GaAs substrate.

Large area displays comprising micro LEDs may be formed from a plurality of red, green and blue micro LED. For example, for a 4K resolution display, around 8,300,000 pixels may be provided per display. Accordingly, 8,300,000 Red, Green and Blue LED may be provided to form a single display (i.e. 24,900,000 LEDs total per display). The Red, Green and Blue LEDs may be assembled on a display substrate using a pick and place technology. Pick and place technologies include stamp systems, laser assisted systems and fluidic assembly. The assembly rate varies from around 1,000 to 10,000 components per second. Accordingly, the assembly time for a 4K screen is around 1 hour.

When assembling displays using pick and place components, the fault rate of the pick and place components may affect the yield of the displays. For example, the 4K resolution display example above includes 24,900,000 LEDs. Thus, with such large numbers of LEDs, even relatively small fault rates may result in a number of faulty LEDs being included in the display.

Against this background, it is an object of the invention to provide an improved method of forming electronic devices suitable for assembly using a pick place process.

SUMMARY

The present inventors have realised that to try to reduce the fault rate of pick and place components such as monolithic electronic devices comprising Group III-nitrides, it is desirable to test each of the components prior to their use in a pick and place assembly. However, individually testing each component is time consuming.

Accordingly, a method of forming and testing a plurality of monolithic electronic devices is provided. The method comprises a) forming a monolithic electronic device array comprising:
  forming a common semiconducting layer comprising a Group III-nitride on a sacrificial substrate;
  forming an array of monolithic electronic devices on a surface of the common semiconducting layer on an opposite side of the common semiconducting layer to the sacrificial substrate, each monolithic electronic device of the array of monolithic electronic devices comprising a plurality of Group III-nitride layers;
  forming a planarising dielectric layer over the array of monolithic electronic devices to provide a planarised dielectric surface which is generally aligned with the surface of the common semiconducting layer;
  forming a grid of trenches by etching the planarising dielectric layer and the common semiconducting layer from the planarised dielectric surface through to the sacrificial substrate, wherein the grid of trenches surrounds each monolithic electronic device;
  forming first electrical contacts to each monolithic electronic device through the planarising dielectric layer,
  forming a sacrificial dielectric layer over the grid of trenches and the planarised surface of the planarising dielectric layer to form a first bonding surface generally aligned with the surface of the common semiconducting layer, wherein the first bonding surface comprises first apertures aligned with each of the first electrical contacts;

b) providing a test substrate comprising:
  an electronics substrate comprising electronics testing circuitry configured to supply power to each of the monolithic electronic devices of the monolithic electronic device array;
  and
  a plurality of second electrical contacts arranged on the electronics substrate to correspond to an arrangement of the first electrical contacts of the monolithic electronic device array;
  wherein a bonding dielectric layer is formed on the electronics substrate to provide a second bonding surface, the second bonding surface comprising second apertures aligned with each of the second electrical contacts;

c) aligning the second electrical contacts of the test substrate with the first electrical contacts of the monolithic electronic device array and bonding the second bonding surface of the test substrate to the first bonding surface of the sacrificial dielectric layer such that the first and second electrical contacts are in electrical contact;

d) supplying power from the test substrate to the monolithic electronic device array to test each of the monolithic electronic devices of the monolithic electronic device array via the plurality of first and second electrical contacts; and e) selectively removing first portions of the sacrificial substrate through a thickness of the sacrificial substrate to separate each of the monolithic electronic devices; and removing the sacrificial dielectric layer to separate each monolithic electronic device from the test substrate.

The method according to the first aspect includes bonding the monolithic electronic device array to a test substrate. As such, the test substrate provides a handling substrate to allow for the removal of the sacrificial substrate on which the monolithic electronic devices are formed. Additionally, the test substrate allows for the testing of each of the monolithic electronic devices to be integrated into the manufacturing process. Thus the method according to the first aspect provides a more efficient method of forming and testing a plurality of monolithic electronic devices due to the integration of device testing into the method.

In the following passages different aspects of the invention are defined in more detail. Each aspect so defined may be combined with any other aspect or aspects unless clearly indicated to the contrary. In particular, any feature indicated as being optional or advantageous may be combined with any other feature or features indicated as being optional or advantageous.

In some embodiments, the bonding dielectric layer is a sacrificial bonding dielectric layer, wherein the sacrificial bonding dielectric layer is configured to be selectively removed with the sacrificial dielectric layer to separate each monolithic electronic device from the text substrate. In some embodiments, the test substrate may be bonded to the bonding surface of the sacrificial dielectric layer by a direct bond (i.e. a fusion bond). For example, in some embodiments, the sacrificial bonding dielectric layer may comprise $SiO_2$ or $SiN_x$.

In some embodiments, following the removal of the sacrificial dielectric layer to separate each monolithic electronic device from the test substrate, the test substrate may be reused in a method of forming and testing a plurality of monolithic devices.

In some embodiments, the electronics testing circuitry of the test substrate is configured to supply power to each of the monolithic electronic devices in parallel. Accordingly, the test substrate may provide an efficient method for testing the array of monolithic devices.

In some embodiments, the common semiconducting layer may comprise an n-type doped Group III-nitride. For example, in some embodiments, the common semiconducting layer may comprise GaN and an n-type dopant, for example Si or Ge. The common semiconducting layer may have a thickness (in a direction normal to the sacrificial substrate) of at least 500 nm. The common semiconducting layer may have a thickness (in a direction normal to the sacrificial substrate) of no greater than 5 μm.

The sacrificial substrate may be formed from a substrate configured to provide a sacrificial substrate surface with an in-plane lattice constant suitable for the growth of a Group III-nitride layer thereon. For example, the sacrificial substrate may comprise sapphire, or a silicon substrate.

In some embodiments, the array of monolithic electronic devices may be formed as a regularly spaced array. The regularly spaced array may resemble any configuration for the close-packing of circles (or polygons), such as square packing or hexagonal packing. Each monolithic electronic device within the array may have a surface area on the common semiconducting layer which is generally elliptical, or a polygon shape.

In some embodiments, the planarising dielectric layer may be formed from a plurality of passivation layers. Each passivation layer may comprise a dielectric, for example silicon dioxide, or silicon nitride. The planarising dielectric layer may be subjected to a chemical mechanical polishing process in order to improve the smoothness (i.e. to reduce the surface roughness) of the planarised dielectric surface.

In some embodiments, the grid of trenches may have a width (in a direction between adjacent monolithic electronic devices in the array of monolithic electronic devices) on a surface of the sacrificial substrate of at least 500 nm. As such, the pixel defining trenches may separate each monolithic LED pixel from adjacent monolithic LED pixels on the sacrificial substrate. As such, the pixel defining trenches may surround (i.e. encircle) a perimeter of each monolithic LED pixel on the sacrificial substrate.

In some embodiments, the sacrificial dielectric layer may comprise a one or more of silicon dioxide, or silicon nitride. The sacrificial dielectric layer may be formed as a substantially continuous gap-filling layer. As such, the sacrificial dielectric layer may be provided to fill any gaps or voids to provide the bonding surface. As such, the as-formed bonding surface may be a substantially continuous planar surface aligned with the surface of the common semiconducting layer. In some embodiments, the bonding surface is parallel to the surface of the common semiconducting layer. In some embodiments, the sacrificial dielectric layer is formed such that it has a thickness on the planarised surface of at least 500 nm. It will be appreciated that due to the uneven nature of the intermediate structure, the thickness of the sacrificial dielectric layer in other regions may be thicker (or thinner). In some embodiments, the sacrificial dielectric layer is formed such that it has a thickness on the planarised surface of no greater than 2 μm.

In some embodiments, each monolithic electronic device of the monolithic electronic device array comprises a light emitting diode (LED). Each LED may be formed from a plurality of Group-III nitride layers. In some embodiments, each monolithic electronic device may comprise one or more electronic devices selected from the group comprising: a transistor, a capacitor, a resistor, a diode. For example, in one embodiment, a monolithic electronic device may comprise a transistor, a LED and a capacitor.

In some embodiments, each monolithic electronic device is a monolithic light emitting diode (LED) pixel comprising a plurality of LED subpixels on the surface of the common semiconducting layer. Each LED subpixel comprises a stack of Group III-nitride layers. The monolithic LED pixels may each be suitable for assembly in a LED display. Each LED subpixel of the monolithic LED pixel may have an associated light extraction feature. Accordingly, each monolithic LED pixel may comprise a plurality of LED devices which are formed monolithically on the common semiconducting layer. Once separated, the monolithic LED pixels may be assembled to form a display, for example using a pick and place methodology. By forming a plurality of LED devices (the LED subpixels) monolithically, the number of discrete components to be assembled to form a display may be reduced.

In some embodiments, each LED subpixel is configured to generate light having a first wavelength of at least 380 nm. As such, each LED subpixel may generate visible light. In some embodiments, each LED subpixel is configured to generate light having a first wavelength of no greater than 490 nm. As such each LED subpixel may generate substantially blue visible light. In this disclosure, where an LED is mentioned as generating light of a specific wavelength, it will be appreciated that this refers to a peak wavelength of the light generated by the LED.

In some embodiments for forming a monolithic LED pixel, following bonding of the test substrate the monolithic electronic device array, the method comprises forming light extraction features for each of the monolithic LED pixels comprising: selectively removing second portions of the sacrificial substrate aligned with each of the LED subpixels.

As such, in some embodiments a plurality of monolithic electronic devices (e.g. LED subpixels) may be provided on the common semiconducting layer comprising a Group III-nitride. The common semiconducting layer is formed on a sacrificial substrate.

Accordingly, the method according to the first aspect allows for the processing of both major surfaces of the common semiconducting layer by providing a sacrificial substrate and a test substrate. The sacrificial substrate provides an initial substrate on which the common semiconducting layer and the monolithic electronic devices may be formed. The monolithic electronic devices may subsequently be attached to the test substrate to allow portions of the sacrificial substrate to be removed in order to form further device features (e.g. light extraction features) on the opposing side of the common semiconducting layer. By processing both major surfaces of the common semiconducting layer, a plurality of monolithic electronic devices may be formed monolithically on the common semiconducting layer.

In some embodiments, forming light extraction features for each of the monolithic LED pixels comprises patterning the first portions of the surface of the common semiconducting layer with scattering features configured to increase a light extraction efficiency of each LED subpixel. Thus, the common semiconducting layer may be further processed to improve the efficiency of the LED subpixels.

In some embodiments, forming light extraction features for each of the monolithic LED pixels comprises selectively removing second portions of the sacrificial substrate aligned with each of the LED subpixels to form a container volume for each LED subpixel, and providing a first colour converting layer in at least one of the container volumes of each monolithic LED pixel. The first colour converting layer may be configured to absorb light of a first wavelength and emit converted light of a first converted light wavelength longer than the first wavelength. In some embodiments, the first converted light wavelength is at least 500 nm. Accordingly, the monolithic LED pixel may include LED subpixels which emit light having a first wavelength and LED subpixels which emit light having the first converted light wavelength. In some embodiments, the first converted light wavelength may be no greater than 650 nm. Accordingly, the monolithic pixel may be configured to provide visible light having colours selected from Red, Green or Blue LEDs.

In some embodiments, a second colour converting layer is provided in in at least one other of the container volumes of each monolithic LED pixel, the second colour converting layer configured to absorb light of a first wavelength and emit converted light of a second converted light wavelength longer than the first converted light wavelength. Accordingly, the monolithic LED pixel according to the first aspect may be configured to emit light comprising three different wavelengths (first wavelength, first converted light wavelength, second converted light wavelength).

In some embodiments, the first colour converting layer and/or the second colour converting layer comprises a phosphor, an organic molecule, or quantum dots. Accordingly, the first and/or second colour converting layers may be provided to convert light of the first wavelength such that the monolithic LED pixel may emit light having a combination of different wavelengths.

In some embodiments, each Group III-nitride layer of each LED subpixel may comprise one of more of AlInGaN, AlGaN, InGaN and GaN. As used herein, any reference to a species by its constituent components includes all available stoichiometries thereof. Thus, for example, AlGaN includes all alloys thereof, such as $Al_xGa_{1-x}N$ wherein x does not equal 1 or 0. The stoichiometries of each layer may vary depending on the function of the specific layer.

For example, in some embodiments, each LED subpixel may comprise a superlattice of Group III-Nitride layers, an active layer configured to generate light, an electron blocking layer, and one or more p-type semiconducting layers. The active layer may comprise one or more quantum well layers, the quantum well layers configured to generate light.

In some embodiments, following the formation of the planarising dielectric layer, third portions of the planarising dielectric layer may be selectively removed and an anode contact metallisation may be formed between an anode of each LED subpixel and the planarised dielectric surface. In some embodiments, following the formation of the planarising dielectric layer, fourth portions of the planarising dielectric layer may be selectively removed and a common cathode contact metallisation is formed for each monolithic LED pixel between the common semiconducting layer and the planarised dielectric surface.

In some embodiments, a surface of the common cathode contact metallisation forming part of the planarised dielectric surface overlaps with at least one of the LED subpixels forming each monolithic LED pixel. Accordingly, each LED subpixel of the monolithic LED pixel may be provided with electric contacts in a space efficient manner.

In some embodiments, one of the LED subpixels of each monolithic LED pixel has a greater surface area on the common semiconducting layer than another LED subpixel of each monolithic LED pixel.

In some embodiments, each monolithic LED pixel comprises at least three, or at least four LED subpixels of the LED array formed monolithically on the common semiconducting layer. For example, in one embodiment, each monolithic LED pixel may comprise four LED subpixels of a square-packed array.

In some embodiments, each of the monolithic LED pixels formed may be a monolithic micro LED pixel. As such, each of the LED subpixels may be a micro LED subpixel which has a size of no greater than 100 µm×100 µm. In some embodiments, the surface area of each LED subpixel on the common semiconducting layer may define an area of no greater than 100 µm×100 µm. In some embodiments, the surface area of each LED subpixel on the common semiconducting layer may define an area of no greater than: 50 µm×50 µm, 30 µm×30 µm, 20 µm×20 µm, or 10 µm×10 µm.

According to a second aspect of the disclosure, a monolithic device array for bonding to the test substrate of the third aspect is provided. The monolithic device array comprises a sacrificial substrate, a common semiconducting layer, an array of monolithic electronic devices, a planarising dielectric layer, first electrical contacts and a sacrificial dielectric layer. The common semiconducting layer comprises a Group III-nitride and is provided on the sacrificial substrate. The array of monolithic electronic devices is provided on a surface of the common semiconducting layer on an opposite side of the common semiconducting layer to the sacrificial substrate. Each monolithic electronic device of the array of monolithic electronic devices comprises a plurality of Group III-nitride layers. The planarising dielectric layer is provided on the array of monolithic electronic devices to provide a planarised dielectric surface which is aligned with the surface of the common semiconducting layer. The planarising dielectric layer defines a grid of trenches extending from the planarised dielectric surface through to the sacrificial substrate, wherein the grid of trenches surrounds each monolithic electronic device. The first electrical contacts are provided for each monolithic electronic device. The first electrical contacts extend from each monolithic electronic device to the planarised dielectric surface. The sacrificial dielectric layer is provided within the grid of trenches and over the planarised surface of the planarising dielectric layer to provide a first bonding surface generally aligned with the surface of the common semiconducting layer. The first bonding surface comprises first apertures aligned with each of the first electrical contacts.

Accordingly, the second aspect of the disclosure provides a monolithic device array which is configured to be bondable to the test substrate of the third aspect of the disclosure. The monolithic device array of the second aspect of the disclosure may be formed as part of the method of the first aspect. The second aspect of the disclosure provides an array of monolithic electronic devices which can be tested in parallel by bonding them to the test substrate of the third aspect of the disclosure. It will be appreciated that the monolithic device array may include any of the optional features of the monolithic device array discussed above in relation to the first aspect of the disclosure.

In some embodiments, each monolithic electronic device of the monolithic electronic device array comprises a light emitting diode (LED). Thus, the monolithic device array of the second aspect provides an as-formed array of the monolithic LEDs which can be efficiently tested.

In some embodiments, each monolithic electronic device is a monolithic light emitting diode (LED) pixel comprising a plurality of LED subpixels on the surface of the common semiconducting layer, each LED subpixel comprising a stack of Group III-nitride layers.

According to a third aspect of the disclosure, a test substrate for bonding to the monolithic device array of the second aspect of the disclosure is provided. The test substrate comprises an electronics substrate, a plurality of second electrical contacts, and a bonding dielectric layer. The electronics substrate comprises electronics testing circuitry configured to supply power to each of the monolithic electronic devices of the monolithic electronic device array. The plurality of second electrical contacts are arranged on the electronics substrate to correspond to an arrangement of the first electrical contacts of the monolithic electronic device array. The bonding dielectric layer is formed on the electronics substrate to provide a second bonding surface. The second bonding surface comprises second apertures aligned with each of the second electrical contacts.

Accordingly, the third aspect of the disclosure provides a test substrate which is configured to be bondable to the monolithic device array of the second aspect of the disclosure. The test substrate may be provided in accordance with the method as described in the first aspect of the disclosure. It will be appreciated that the test substrate may include any of the optional features of the test substrate discussed above in relation to the first aspect of the disclosure.

In some embodiments, the bonding dielectric layer is a sacrificial bonding dielectric layer. The sacrificial bonding dielectric layer is configured to be selectively removed with the sacrificial dielectric layer to separate each monolithic electronic device from the text substrate.

In some embodiments, the sacrificial bonding dielectric layer is configured to be selectively removed such that the test substrate may be reused for bonding to a monolithic electronic device.

In some embodiments, an etch stop layer may be provided between the bonding dielectric layer and the electronics substrate.

In some embodiments, the electronics testing circuitry of the test substrate is configured to supply power to each of the monolithic electronic devices in parallel.

BRIEF DESCRIPTION OF THE FIGURES

The disclosure will now be described in relation to the following non-limiting figures. Further advantages of the disclosure are apparent by reference to the detailed description when considered in conjunction with the figures, which are not to scale so as to more clearly show the details, wherein like reference numbers indicate like elements throughout the several views, and wherein.

DETAILED DESCRIPTION

According to this disclosure, methods of forming and testing a monolithic electronic device are provided. According to a first embodiment of the disclosure, the monolithic electronic device formed and tested is a monolithic LED pixel 1. Of course, it will be appreciated that the present disclosure is not limited to the formation of monolithic LED pixels, and that other monolithic electronic devices may be formed in place of the monolithic LED pixels 1. For example, the monolithic electronic device according to the disclosure may comprise one or more of: a capacitor, a transistor, a resistor, a diode, a LED. For example, in one embodiment, each monolithic electronic device may comprise a LED and a transistor formed on a common semiconducting layer 102. The transistor may be configured to control a drive current to the LED, such that each monolithic electronic device is configured to provide a LED and an associated driving transistor.

Figure 1:
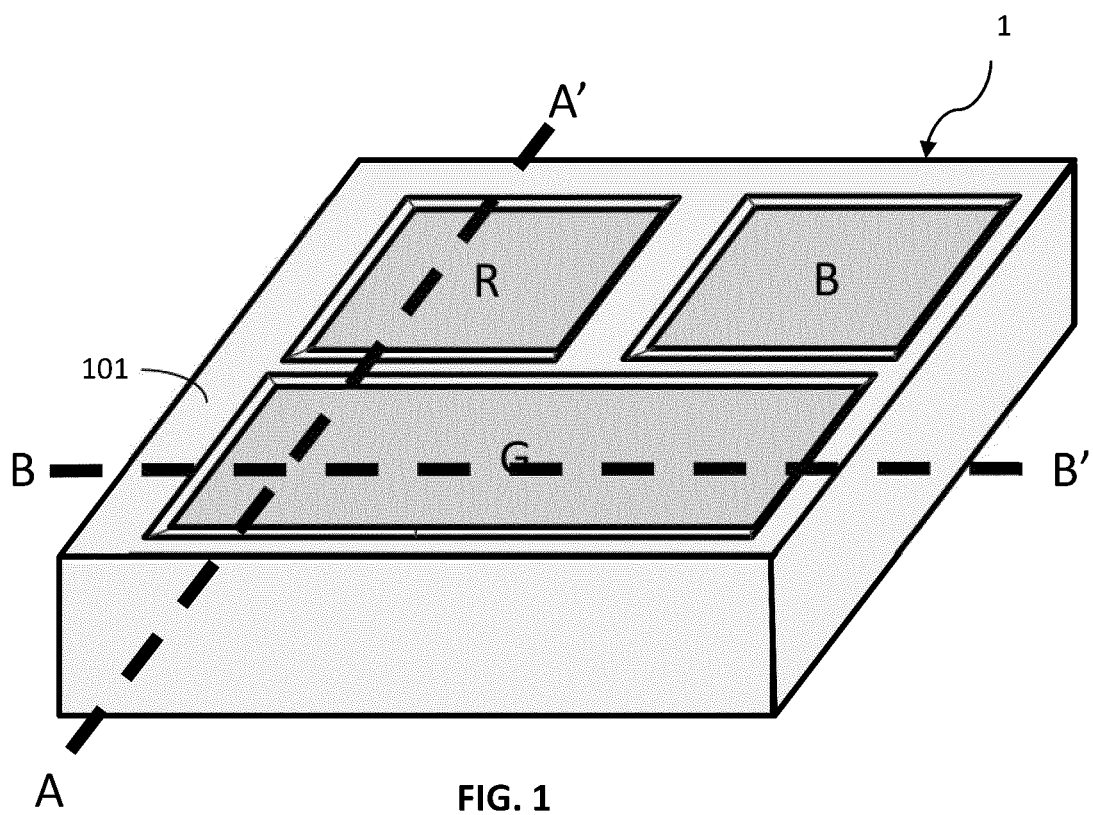
FIG. 1 shows an isometric diagram of a light emitting side of a monolithic LED pixel according to an embodiment of this disclosure.

According to the first embodiment of the disclosure, the monolithic LED pixel 1 may comprise a plurality of LED subpixels 10, 20, 30. An isometric schematic diagram of the monolithic LED pixel 1 of the first embodiment is shown in FIG. 1. The monolithic LED pixel of FIG. 1 comprises three LED subpixels 10, 20, 30. The three LED subpixels 10, 20, 30 are each configured to emit a different (peak) wavelength of light.

Figure 2:
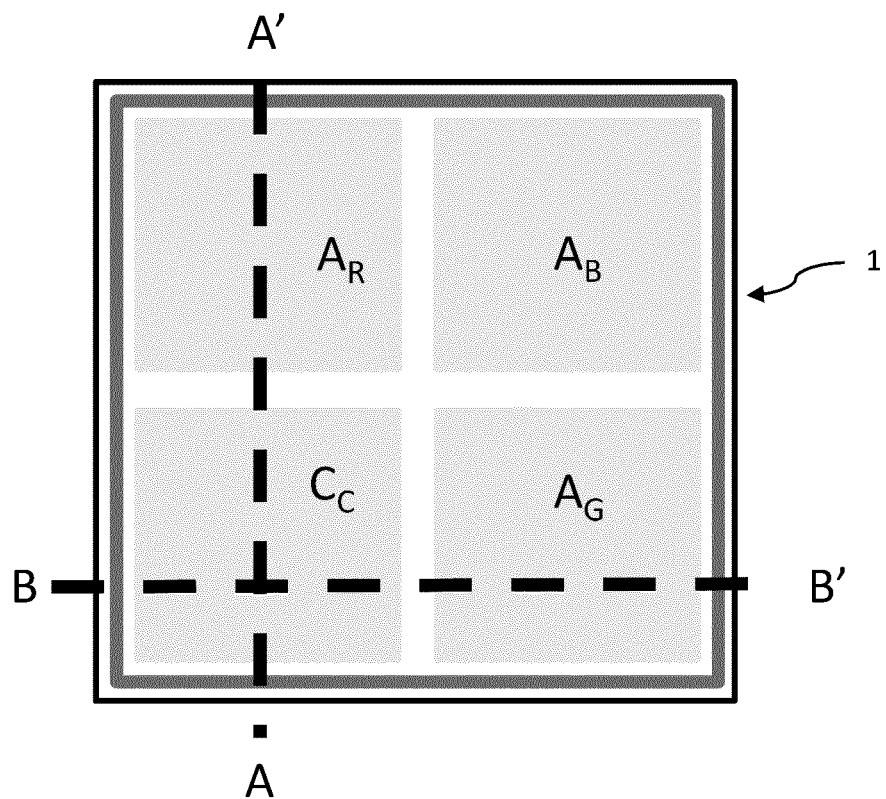
FIG. 2 shows a plan view diagram of a contact side of the monolithic LED pixel of FIG. 1.

A plan view of the monolithic LED pixel 1 is shown in FIG. 2. Next, a method of forming the monolithic LED pixel 1 will be described with reference to FIGS. 3 to 19 and FIGS. 20 to 30. FIGS. 3 to 19 show a cross section of the monolithic LED pixel 1 along line A-A' shown in FIG. 2 during intermediate steps in the method of forming the monolithic LED pixel 1. FIGS. 20 to 30 show a cross section of the monolithic LED pixel 1 along line B-B' shown in FIG. 2 during intermediate steps in the method of forming the monolithic LED pixel 1.

The method of forming the monolithic LED pixel 1 according to the first embodiment comprises the formation of an intermediate array of LED subpixels 100. The intermediate array of LED subpixels 100 comprises a plurality of LED subpixels 103 formed on a sacrificial substrate 101.

In order to form the intermediate array of LED subpixels 100, a common semiconducting layer 102 comprising a Group III-nitride is formed on a first major surface 131 of the sacrificial substrate 101. As such, the method of forming the monolithic LED pixel 1 comprises forming a common semiconducting 102 layer comprising a Group III-nitride on a sacrificial substrate 101.

Figure 3:
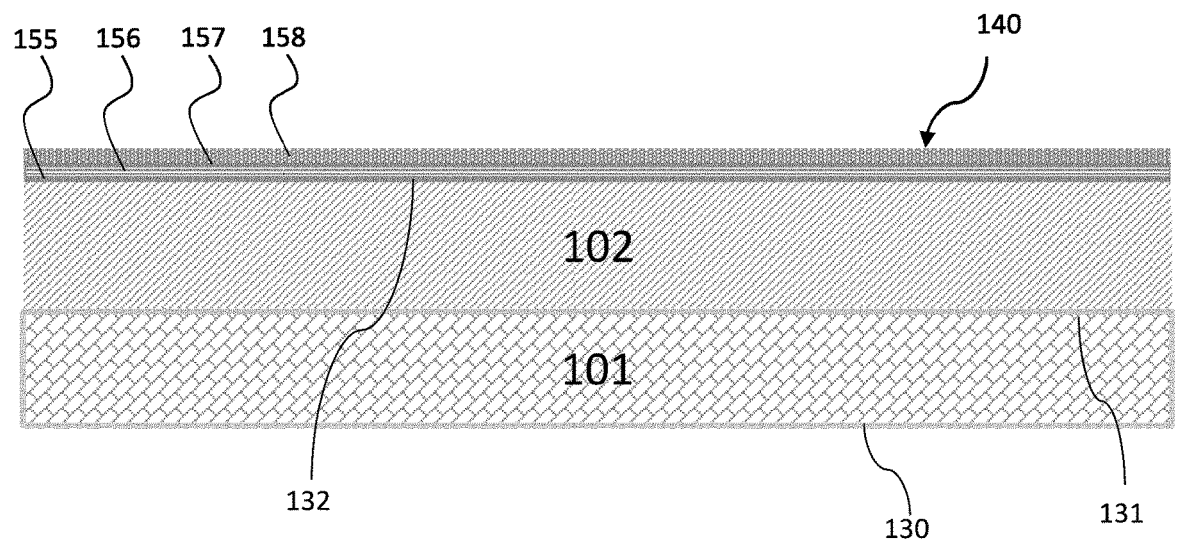
FIG. 3 shows a first intermediate step in the method of forming a monolithic LED pixel according to an embodiment of this disclosure.

The sacrificial substrate 101 may comprise a silicon substrate, a silicon carbide substrate, or a sapphire substrate. In the embodiment of FIG. 3 the sacrificial substrate 101 comprises a silicon substrate with a plurality of Group III-nitride buffer layers formed thereon.

As shown in FIG. 3, the common semiconducting layer 102 may be formed on a surface of the sacrificial substrate 101 as a substantially continuous film. As such, the common semiconducting layer 102 covers substantially all of a surface of the sacrificial substrate 101. The common semiconducting layer 102 may comprise an n-type doped Group III-Nitride semiconductor. For example, in the embodiment of FIG. 3 the common semiconducting layer 102 comprises GaN. The common semiconducting layer 102 in FIG. 3 may be n-type doped with any suitable n-type dopant, for example Si, or Ge. The common semiconducting layer 102 may be formed on the sacrificial substrate 101 by any suitable method for the formation of Group III-Nitrides such as metal-organo chemical vapour deposition (MOCVD), or molecular beam epitaxy (MBE).

Next, an array of LED subpixels may be formed on a surface 132 of the common semiconducting layer 102. The array of LED subpixels are formed on an opposite side of the common semiconducting layer 102 to the sacrificial substrate 101. Each LED subpixel 103 comprises a stack of Group III-Nitride layers. Various methods for the formation of an array of LED subpixels is known to the skilled person.

In the embodiment of FIG. 3, the array of LED subpixels are formed from a continuous stack of Group III-Nitride layers 140. The as-deposited continuous stack of Group III-nitride layers 140 covers substantially all of a second major surface 132 of the common semiconducting layer 102. The continuous stack of Group III-nitride layers 140 may subsequently be patterned using a selective removal process to define the array of LED subpixels 103. One possible selective removal process comprises coating the continuous stack of Group III-nitride layers 140 with a mask layer using a lithography process and etching the regions of the continuous stack of Group III-nitride layers 140 to be selectively removed. An example of a resulting array of LED subpixels 103 is shown in FIG. 4 of the disclosure.

In some embodiments, for example as shown in FIG. 3, the continuous stack of Group III-nitride layers 140 may comprise a superlattice of Group III-Nitride layers 155, an active layer 156 configured to generate light, an electron blocking layer 157, and one or more p-type semiconducting layers 158. The active layer may comprise one or more quantum well layers, the quantum well layers configured to generate light. In the embodiment of FIG. 3, the active layer of each LED subpixel is configured to generate light having a wavelength of at least 380 nm, and no greater than 490 nm.

Accordingly, each LED subpixel 103 which is formed from the continuous stack of Group III-nitride layers 140 may comprise a superlattice of Group III-Nitride layers 155, an active layer 156 configured to generate light, an electron blocking layer 157, and one or more p-type semiconducting layers 158. The formation of each of the layers of the LED subpixels is known to the skilled person, for example as further discussed in at least GB 1811109.6.

Figure 4:
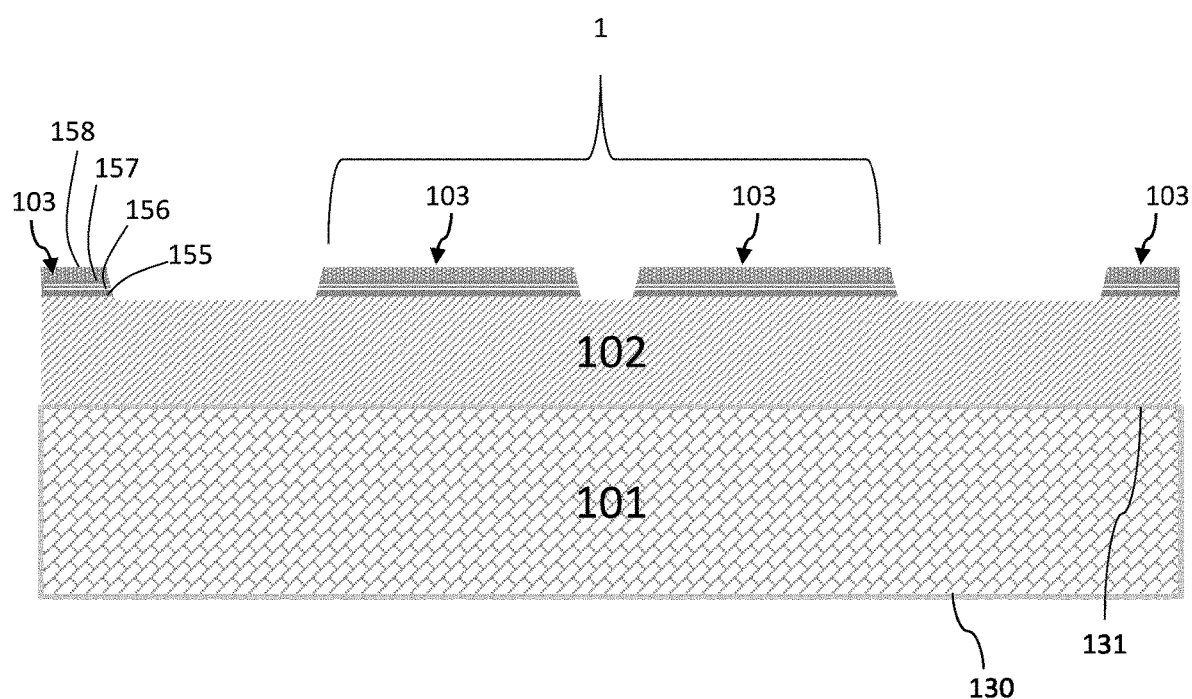
FIG. 4 shows a second intermediate step in the method of forming a monolithic LED pixel according to an embodiment of this disclosure.

Whilst the embodiment of FIG. 3 and FIG. 4 uses a selective removal process to define an array of LED subpixels, it will be appreciated that the method of the present disclosure is not limited to such LED subpixels. For example, a selective area growth method may be used to define an array of LED subpixels comprising stacks of Group III-Nitride layers. Further details of a suitable selective area growth method may be found in at least GB1811109.6.

As shown in FIG. 4, each of the LED subpixels 103 forms a mesa structure extending from the common semiconducting layer 102. Each of the LED subpixels 103 is spaced apart from the other LED subpixels 103 on the common semiconducting layer 102. As shown in FIG. 4 the spacings between each of the LED subpixels 103 may be different. In the embodiment of FIG. 4, the spacings between adjacent LED subpixels 103 intended to form subpixels of the same monolithic LED pixel 1 may be less than the spacing between adjacent LED subpixels of different monolithic LED pixels.

Following the formation of the plurality of LED subpixels 103, the intermediate array 100 may be further processed to include first electrical contacts to each of the LED subpixels 103. It will be appreciated that the skilled person is aware of various methods for forming electrical contacts to semiconductor devices. As such, the first electrical contacts may be formed at various stages during the method of forming a monolithic LED pixel. Accordingly, the present disclosure, which is concerned with the monolithic formation and testing of a monolithic electronic device, is not limited to any specific arrangement of first electrical contacts or methods of forming first electrical contacts.

Figure 5:
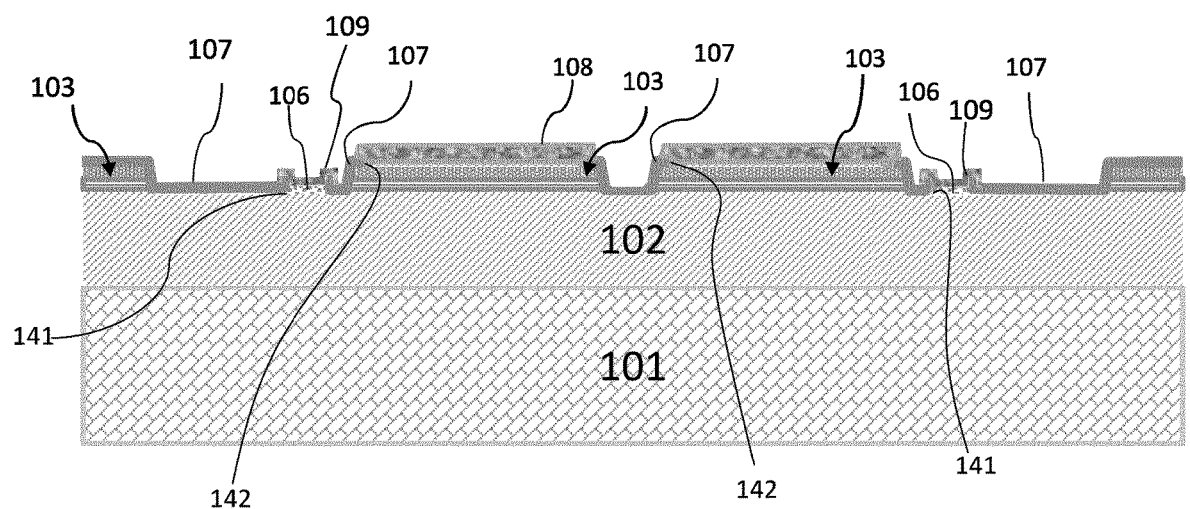
FIG. 5 shows a third intermediate step in the method of forming a monolithic LED pixel according to an embodiment of this disclosure.

According to the first embodiment, the first electrical contacts to each LED subpixel 103 may be formed from a plurality of contact layers. The contact layers may extend from each LED subpixel 103 to the planarised dielectric surface. The contact layer may each be formed in a plurality of steps. For example, as shown in FIG. 5, a plurality of first contact layers 106 may be formed on the common semiconducting layer 102. The first contact layers 106 are configured to provide an electrical contact to the common semiconducting layer 102. In some embodiments, a single first contact layer may be provided for each monolithic LED pixel 1 (i.e. a common contact), or in some embodiments a first contact layer 106 may be provided for each LED subpixel 103. As shown in FIG. 5, a first contact layer 106 is provided for each LED subpixel 103. The first contact layer 106 may comprise any suitable material for forming an Ohmic contact to the common semiconducting layer 102. For example the first contact layer 106 may comprise one or more of titanium, aluminium, titanium nitride, gold, or copper. In the embodiment of FIG. 5, the first contact layer 106 may be deposited using thermal evaporation and patterned using a lithography method such that the first contact layer 106 is provided in the spaces between the LED subpixels 103 on the common semiconducting layer 102. In the embodiment of FIG. 5, the first contact layer 106 may be annealed after it is formed to improve the electrical conductivity of the contact between the first contact layer 106 and the common semiconducting layer 102.

Next, a first passivation layer 107, may be formed over the plurality of LED subpixels 103. The first passivation layer 107 may comprise an insulating layer, such as the dielectric. For example in the embodiment of FIG. 5, the first passivation layer 107 may comprise silicon dioxide, or silicon nitride. The first passivation layer 107 may be formed using a plasma enhanced chemical vapour deposition process, a chemical vapour deposition process, a physical vapour deposition process, evaporation or atomic layer deposition.

Following the formation of the first passivation layer 107 a plurality of openings may be formed though the first passivation layer 107 using a selective removal process such as lithography and etching. The plurality of openings may be provided in order to provide regions for forming the electrical connections to the common semiconducting layer 102 and the p-type semiconducting layer of the LED subpixels 103. For example, in the embodiment of FIG. 5 a plurality of first openings 141 in the first passivation layer 107 are provided to allow for the formation of cathode contact layers 109 in contact with the first contact layer 106 (i.e. and electrical connection to the common semiconducting layer 102), and a plurality of second openings 142 are formed in order to allow for the formation of anode contact layers 108 in electrical contact with the p-type semiconducting layers of the LED subpixels 103.

The anode contact layers 108 may be formed in the second openings 142 on the p-type semiconducting layer of the LED subpixels 103. The anode contact layer 108 may be configured to form an Ohmic contact to the p-type semiconducting layers of the LED subpixels 103. For example, in some embodiments the anode contact layers may comprise one or more of nickel, silver, titanium, or titanium nitride. The second contact layers 108 may be formed using an evaporation technique and patterned using a lithographic method. Accordingly, the anode contact layers 108 may be provided aligned with the plurality of second openings 142 in the passivation layer aligned with each of the p-type semiconducting layers of each of the LED subpixels 103.

Figure 6:
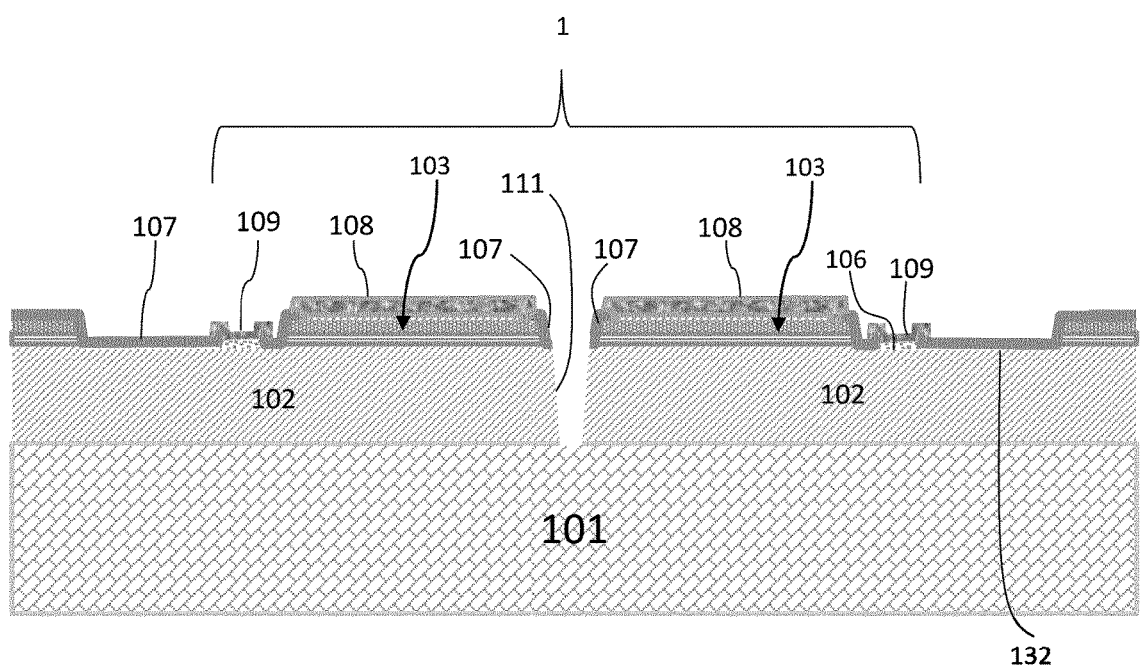
FIG. 6 shows a fourth intermediate step in the method of forming a monolithic LED pixel according to an embodiment of this disclosure.

In some embodiments, the common semiconducting layer 102 for each monolithic LED pixel 1 may be further processed in order to provide cross-talk reducing features. For example in the embodiment of FIG. 1 the common semiconducting layer 102 is subjected to a selective removal process to remove a portion of the common semiconducting layer 102 in a region of each monolithic LED pixel 1 falling between each of the LED subpixels. As such, a portion of the common semiconducting layer 102 between two adjacent LED subpixels 103 (i.e. not covered by the adjacent LED subpixels 103) of a monolithic LED pixel 1 may be selectively removed. An example of such a cross-talk reducing feature is shown in FIG. 6 where a cross-talk reducing trench 111 is formed by a selective removal process. As shown in FIG. 6 a selective removal process (i.e. an etching process) is used to etch a cross-talk reducing trench 111 from the second surface 132 of the common semiconducting layer 102 through to the first surface 131 of the sacrificial substrate 101. The cross-talk reducing trench is provided in a region between adjacent LED subpixels 103 forming part of a monolithic LED pixel 1. Effectively, the cross-talk reducing trench 111 acts to separate regions of the common semiconducting layer 102 corresponding to each subpixel 103. This in turn may prevent, or reduce, light from one LED subpixel 103 travelling across the common semiconducting layer 102 and being emitted through the light extraction features of another LED subpixel 103.

The cross-talk reducing trenches 111 may be formed using any suitable lithography and etching technique known to the skilled person, for example Reactive Ion Etching (RIE) or Inductively Coupled Plasma Etching (ICP).

Figure 7:
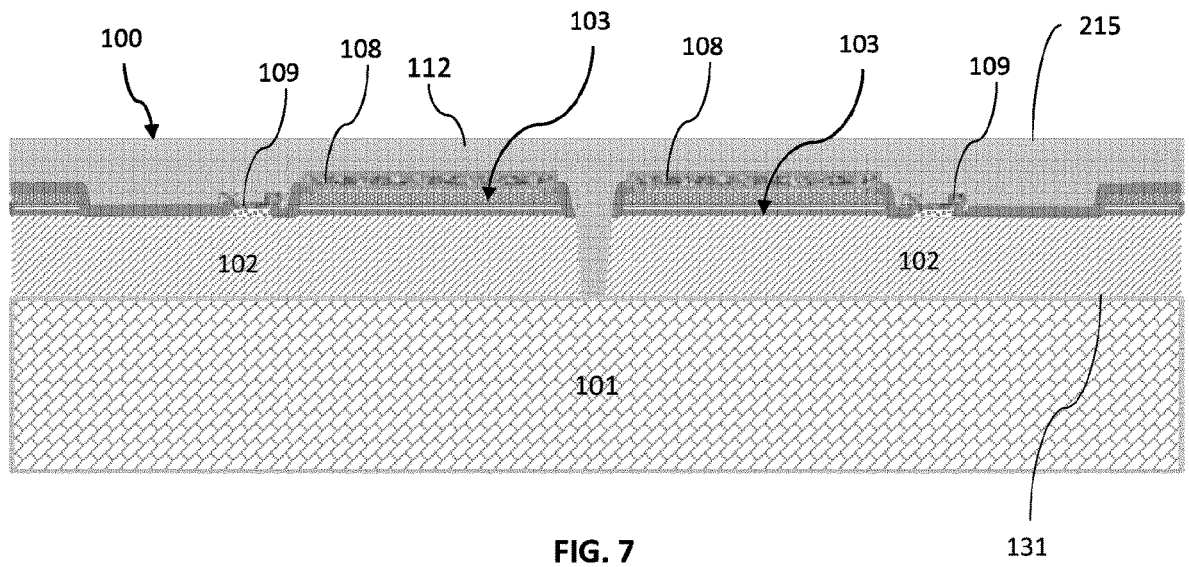
FIG. 7 shows a fifth intermediate step in the method of forming a monolithic LED pixel according to an embodiment of this disclosure.
Figure 8:
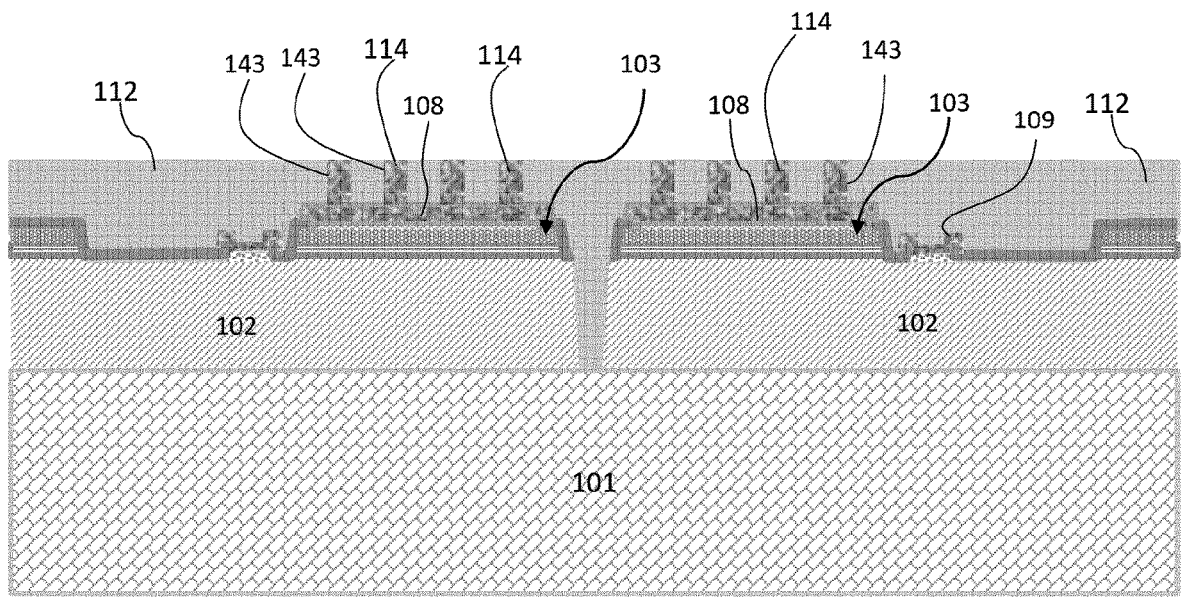
FIG. 8 shows a sixth intermediate step in the method of forming a monolithic LED pixel according to an embodiment of this disclosure.
Figure 9:
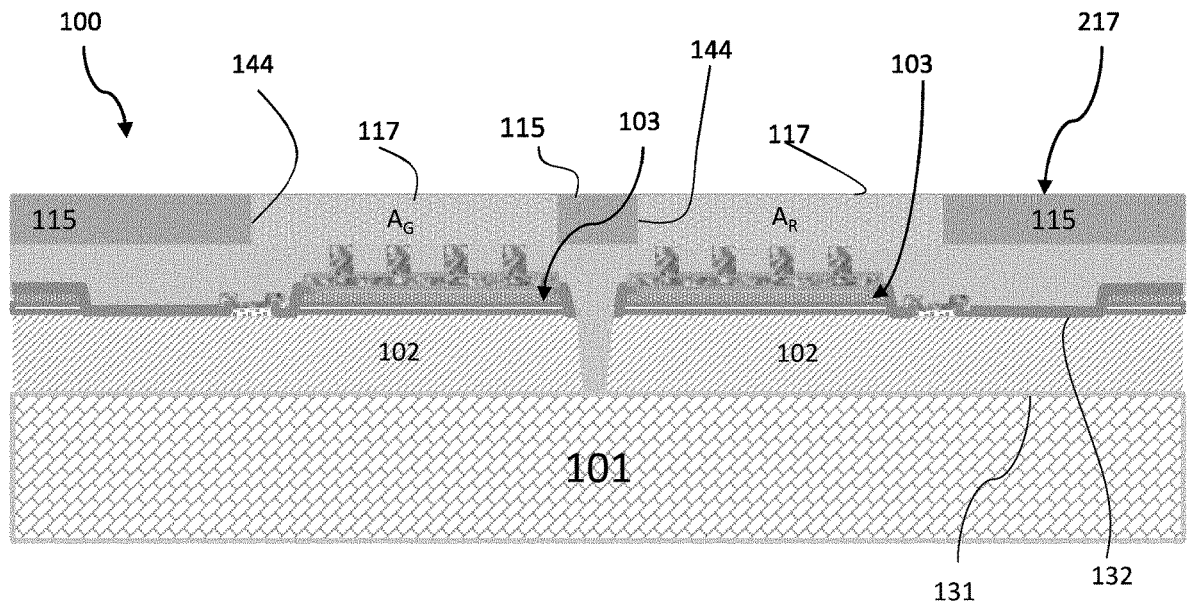
FIG. 9 shows a seventh intermediate step in the method of forming a monolithic LED pixel according to an embodiment of this disclosure.

Following the formation of the optional cross-talk reducing features, a planarising dielectric layer is formed over the intermediate array of LED subpixels 100. Due to the topology of the intermediate array of LED subpixels (e.g. the cross talk reducing features, the LED subpixels 130) and the process of forming electrical contacts, the planarising dielectric layer may be formed in one more process steps. FIGS. 7, 8, and 9 provide one example of a method of forming a planarising dielectric layer according to the first embodiment. The skilled person will appreciate that other methods of forming a planarising dielectric layer are known to the skilled person.

According to the first embodiment, a second passivation layer 112 may be formed over the intermediate array of LED pixels shown in FIG. 6. The second passivation layer 112 may comprise an insulating dielectric, for example silicon dioxide or silicon nitride. The second passivation layer 112 may be formed in a similar manner to the first passivation layer 107. The second passivation layer 112 may be formed over the intermediate structure in order to provide a first planarised surface 215 which is generally aligned with the first surface 131 of the sacrificial substrate 101 on which the monolithic LED pixel 1 is formed. The second passivation layer 112 may be formed in such a manner that is fills the cross-talk reducing trench 111 and also extends beyond the exposed surfaces of the LED subpixels 103.

Following the formation of the second passivation layer 112, a plurality of third openings 143 may be formed in the second passivation layer 112 for the formation of first contact metallisations 114 to form electrical contact to the anode and/or cathode contact layers 108, 109. The plurality of third openings may extend from the passivation surface 215 to the first and/or second contact layers 106, 108. An example of such first contact metallisations is shown in FIG. 8 in which first contact metallisations 114 are formed for each of the second contact layers 108.

As part of forming the planarising dielectric layer according to the first embodiment, a third passivation layer 115 is formed on the passivation surface 215, for example as shown in FIG. 9. The third passivation layer 115 may be formed in a similar manner to the second passivation layer 112. The third passivation layer 115 provides a third passivation layer surface 217 on an opposite side of the third passivation layer 115 to the second passivation layer 112.

Similar to the second passivation layer 112, the third passivation layer 115 may further comprise a plurality of fourth openings 144 aligned with each of the LED subpixels for the provision of contact metallisations. The fourth openings 144 may subsequently be filled with second contact metallisations 117 to form electrical contacts to the p-type semiconducting layer of each LED subpixel 103. Each of the second contact metallisations 117 may comprise a multi-stack of conductive layers. For example, the second contact metallisations 117 may comprise one or more of titanium, tungsten, gold, and copper.

Following formation of the third passivation layer 115 and the various contact metallisations, the third passivation layer surface 217 may be further planarised using a polishing process such as chemical mechanical polishing. The provision of a CMP process may reduce the surface roughness of the third passivation layer surface 217 to improve the bonding of the intermediate array of LED subpixels 100 to the test substrate 200. As such, the chemical mechanical polishing process may be provided in order to improve the smoothness of the surface and to reduce any defects or irregularities in the surface that may have been formed as a result of the etching and contact metallisation deposition processes.

Accordingly, the processes set out in FIGS. 7, 8 and 9 of this embodiment provide a method of forming a planarising dielectric layer on the array of LED subpixels to provide a planarised dielectric surface (i.e. third passivation layer surface 217) which is generally aligned with the second surface 132 of the common semiconducting layer 102. FIGS. 7, 8 and 9 also show the formation of first electrical contacts to each of the monolithic devices. As shown in FIGS. 7, 8 and 9, the first contact layer may be formed from a plurality of contact metallisation layers 114, 117. The first contact layers may also include anode or cathode contact layers for improving the electrical contact to each LED subpixel 103. It will be appreciated that the first embodiment is one example of the formation of first electrical contacts. As such, the first electrical contacts may be provided in various other ways as is known to the skilled person. For example, the formation of electrical contacts may be provided following the formation of the planarising dielectric layer on the intermediate array of LED subpixels 100.

Figure 10:
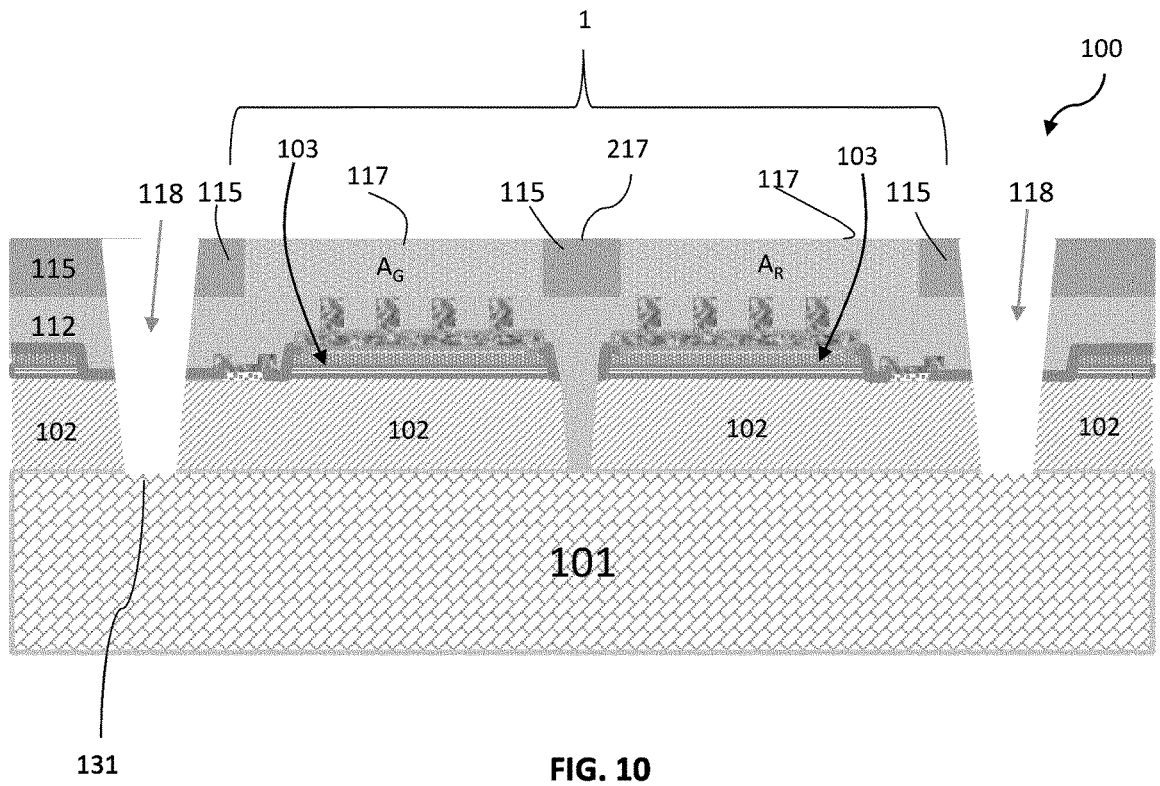
FIG. 10 shows an eighth intermediate step in the method of forming a monolithic LED pixel according to an embodiment of this disclosure.

Following the formation of the planarised dielectric surface 217 over the plurality of LED subpixels 103, the intermediate array of LED subpixels 100 is partially divided into a plurality of monolithic LED pixels 1 by etching a grid of trenches (i.e. pixel defining trenches 118). The pixel defining trenches 118 are formed by selectively removing the layers forming the planarising dielectric layer from the planarised dielectric surface 217 through to the sacrificial substrate 101. An example of the formation of the pixel defining trenches 118 is shown in FIG. 10 of this disclosure. As shown in FIG. 10, each monolithic LED pixel 1 comprises at least two LED subpixels 103. The pixel defining trenches 118 may be formed in a similar manner to the cross-talk reducing trenches 111 discussed above. Following the formation of the pixel defining trenches 118, it will be appreciated that the plurality of monolithic LED pixels 1 remain in a fixed arrangement due to the presence of the sacrificial substrate 101. As such, the plurality of monolithic pixels 1 may still be handled and aligned as part of the intermediate array of LED subpixels 100 due to the presence of the sacrificial substrate 101.

Following the formation of the pixel defining trenches 118, a sacrificial dielectric layer 121 is formed on the pixel trenches and the planarised dielectric surface 217 to form a bonding surface 221 which is generally aligned with the surface of the common semiconducting layer 102.

Figure 11:
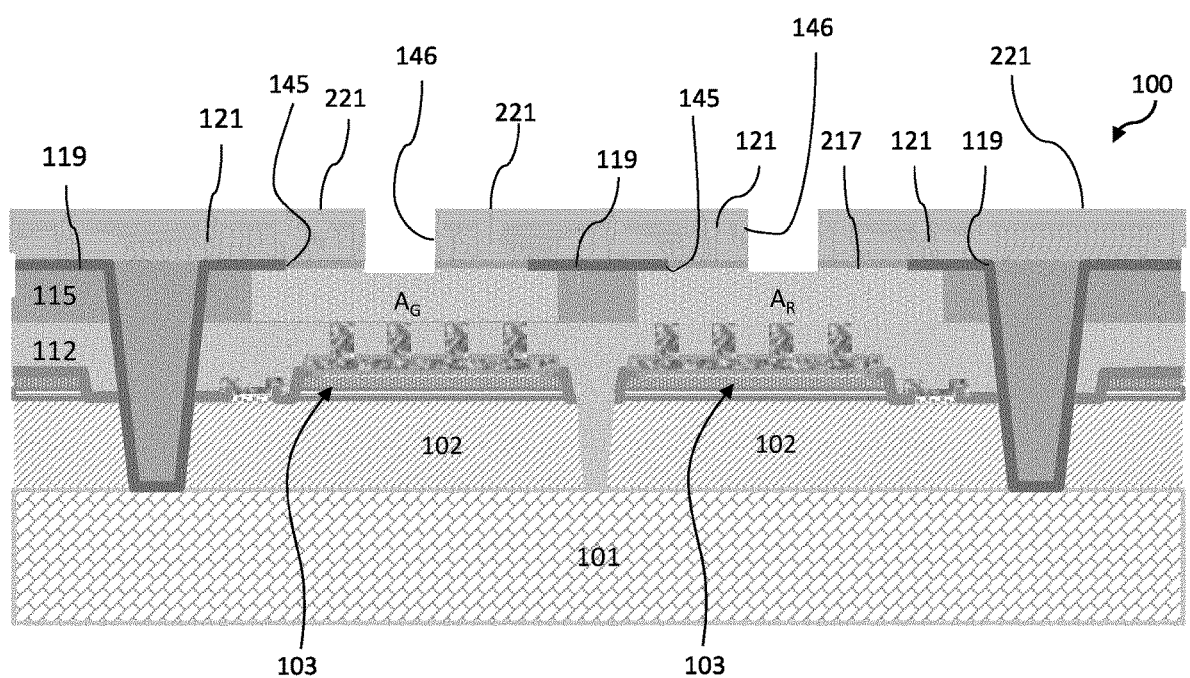
FIG. 11 shows a ninth intermediate step in the method of forming a monolithic LED pixel according to an embodiment of this disclosure.

In the method according to the first embodiment, an etch stop layer 119 may also be provided prior to the formation of the sacrificial dielectric layer 121. For example, as shown in FIG. 11, an etch stop layer 119 is formed over the pixel-defining trenches 118 and the planarised dielectric surface 217 as a substantially continuous layer. The etch stop layer 119 may have a plurality of fifth openings 145 formed through it. Each of the fifth openings 145 of the etch stop layer 119 may be aligned with any contact metallisations 117 present at the planarised dielectric surface 217. In some embodiments, the etch stop layer 119 may comprise silicon dioxide or silicon nitride. The etch stop layer 119 may be configured to provide a dielectric layer which is resistant to a subsequent etching process in which the sacrificial dielectric layer 121 is to be removed. As such, the etch stop layer 119 may increase the process tolerance for the selective removal step in which the sacrificial dielectric layer 121 will subsequently be removed.

Following the formation of the (optional) etch stop layer 119, the sacrificial dielectric layer 121 may be formed over the pixel defining trenches 118 and the planarised surface to form a bonding surface. The formation of the sacrificial dielectric layer 121 may comprise a multi-stage process in which a plurality of layers are formed. The sacrificial dielectric layer 121 may comprise one or more of silicon dioxide, and silicon nitride. As shown in FIG. 11, a plurality of sixth openings 146 may also be formed in the sacrificial dielectric layer 121 to allow for electrical connections to be made to the plurality of LED subpixels 103. Each of the sixth openings 146 may extend from the bonding surface through a thickness of the sacrificial dielectric layer to the layers below (e.g. the contact metallisations 117). The plurality of sixth openings 146 in the sacrificial dielectric layer 121 may be aligned with at least a portion of each of the contact metallisations 117.

Following the formation of the sacrificial dielectric layer 121, the bonding surface 221 may be further planarised using a chemical mechanical polishing process. Accordingly, the sacrificial dielectric layer 121 may provide a generally planar surface which is aligned with the second surface 132 of the common semiconducting layer 102 for the bonding of the plurality of monolithic LED pixels 1 on the sacrificial substrate 101 to a test substrate 200.

Figure 12:
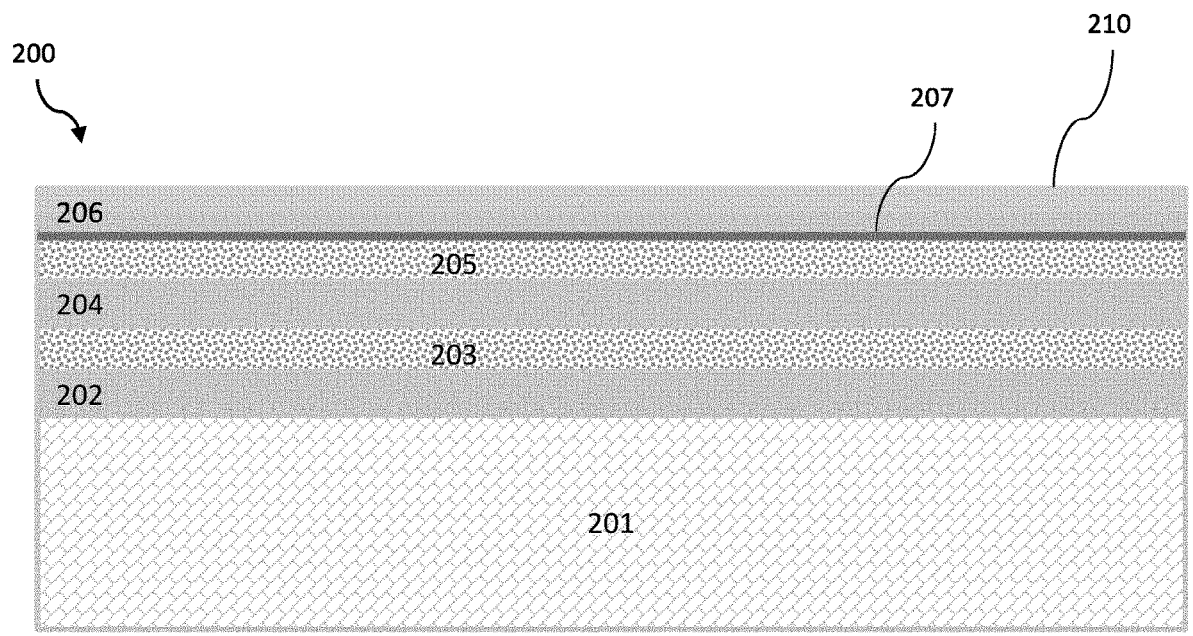
FIG. 12 shows a tenth intermediate step in the method of forming a monolithic LED pixel according to an embodiment of this disclosure.

An example of a test substrate 200 is shown in FIG. 12. The test substrate 200 provides a surface to which the bonding surface 221 of the sacrificial dielectric layer 121 may be bonded.

According to the first embodiment of the disclosure, the test substrate 200 provides a test substrate surface 210 which is to be brought into contact with the bonding surface 221 of the intermediate array of LED subpixels 100 shown in FIG. 11.

In some embodiments, for example as shown in FIG. 12, the test substrate 200 comprises an electronics substrate 201. In some embodiments, the electronics substrate 201 may comprise a silicon wafer, or other any other substrate suitable for the formation of electronic circuitry. In some embodiments, such as the embodiment shown in FIG. 12 a plurality of electronics layers 202, 203, 204, 205, may be provided on a surface of the electronics substrate 201. The plurality of electronics layers may comprise metal layers 202, 204, and insulating layers, 203, 205 in order to form electronic connections and/or circuits on the first electronics substrate 201. The test substrate 200 is configured to provide testing the circuitry for the monolithic LED pixels 1. The test substrate 200 will be discussed in more detail below. The electronics layers 202, 203, 204, 205 may be deposited on the first electronics substrate 201 using any suitable technique such as CVD, PECVD, thermal evaporation, PVD, or ALD.

In some embodiments, the test substrate 200 may comprise a sacrificial test dielectric layer 206. The sacrificial test dielectric layer 206 may provide the test substrate surface 210 of the test substrate 200 for bonding. The sacrificial test dielectric layer 206 may be configured to be at least partially removed along with the sacrificial dielectric layer 121 in order to separate the monolithic LED pixels 1 from the test substrate 200.

In some embodiments for example as shown in FIG. 12, the test substrate 200 may also comprise a test etch stop layer 207. The test etch stop layer 207 may be provided between the sacrificial test dielectric layer 206 and the other layers 201, 202, 203, 204, 205 of the test substrate 200. The test etch stop layer 207 may be configured to provide a surface which is more resistant to the selective removal process used to selectively remove the sacrificial test dielectric layer 206. As such the test etch stop layer 207 provides a layer which is configured to protect the other layers of the test substrate 200 from the selective removal process. Accordingly, the test etch stop layer 207 may improve the reusability of the test substrate 200.

The sacrificial test dielectric layer 206 and the test etch stop layer 207 may be formed as a stack of dielectric layers comprising at least one or more of silicon dioxide and silicon nitride. The sacrificial test layer 206 may be formed with a thickness in a direction normal to the surface of the electronics substrate 201 of at least 50 nm. In some embodiments, the thickness of the sacrificial test dielectric layer 206 may be no greater than 1 µm. The test etch stop layer 207 may have a thickness in the direction normal to the surface of the electronics substrate 201 of at least 20 nm. In some embodiments, the thickness of the test etch stop layer 207 may be no greater than 100 nm.

In some embodiments of this disclosure, the test substrate 200 may provide a substrate on which the plurality of monolithic LED pixels 1 are held while the light emitting surface 130 of the sacrificial substrate 101 is further processed.

Figure 13:
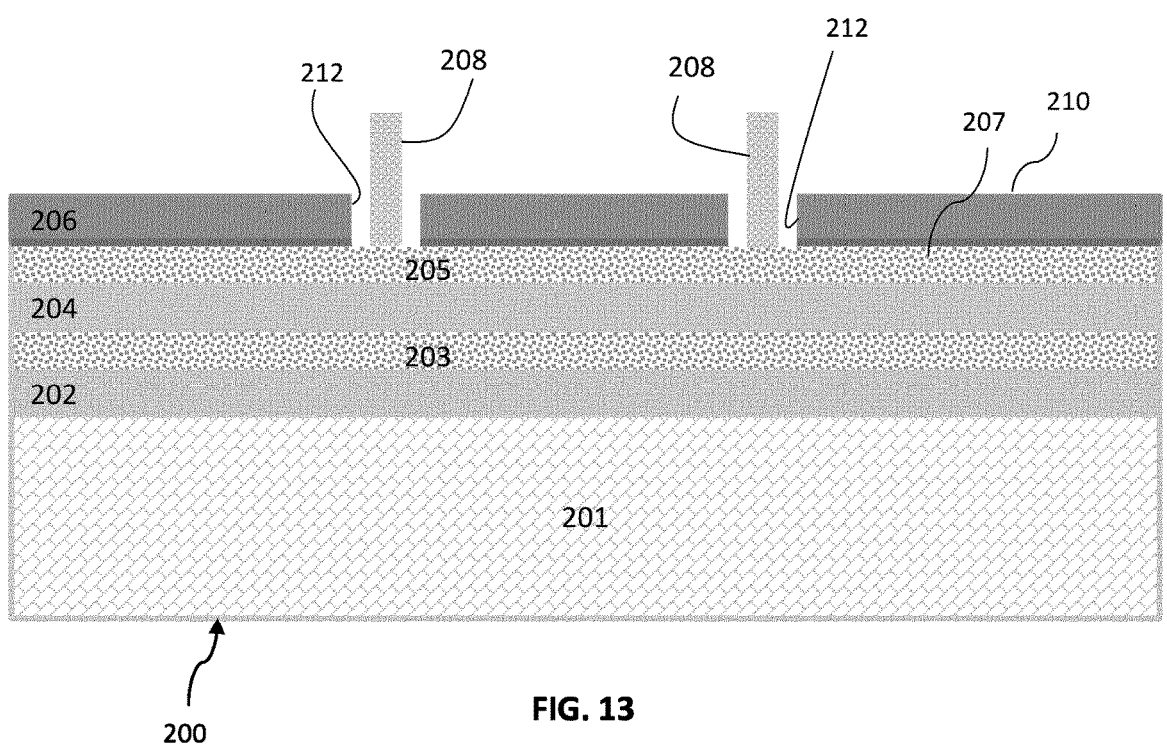
FIG. 13 shows an eleventh intermediate step in the method of forming a monolithic LED pixel according to an embodiment of this disclosure.

As shown in FIG. 13, the test substrate may comprise the electronics substrate 201 comprising electronics testing circuitry configured to supply power to each of the monolithic electronic devices of the monolithic electronic device array. The test substrate may also comprise a plurality of test substrate electrical contacts arranged on the electronics substrate 201 to correspond to the arrangement of the contact metallisations 117 of the intermediate array of LED subpixels. In some embodiments, the sacrificial test dielectric layer 206 is formed on the electronics substrate 201 to provide a test bonding surface, the test bonding surface comprising apertures aligned with each of the testing substrate electrical contacts.

Following the bonding process, the test substrate 200 may be configured to test each of the monolithic electronic devices (e.g. each of the LED subpixels 103) by supplying power from the test substrate 200 to the array of LED subpixels array to test each of the LED subpixels 103. As such, the test substrate 200 may form electrical circuits between the test substrate electrical contacts and the contact metallisations of the intermediate array of LED subpixels. As such, each of the LED subpixels 103 may be tested in parallel using a testing process which is integrated into the method of forming the monolithic LED pixels 1.

Figure 14:
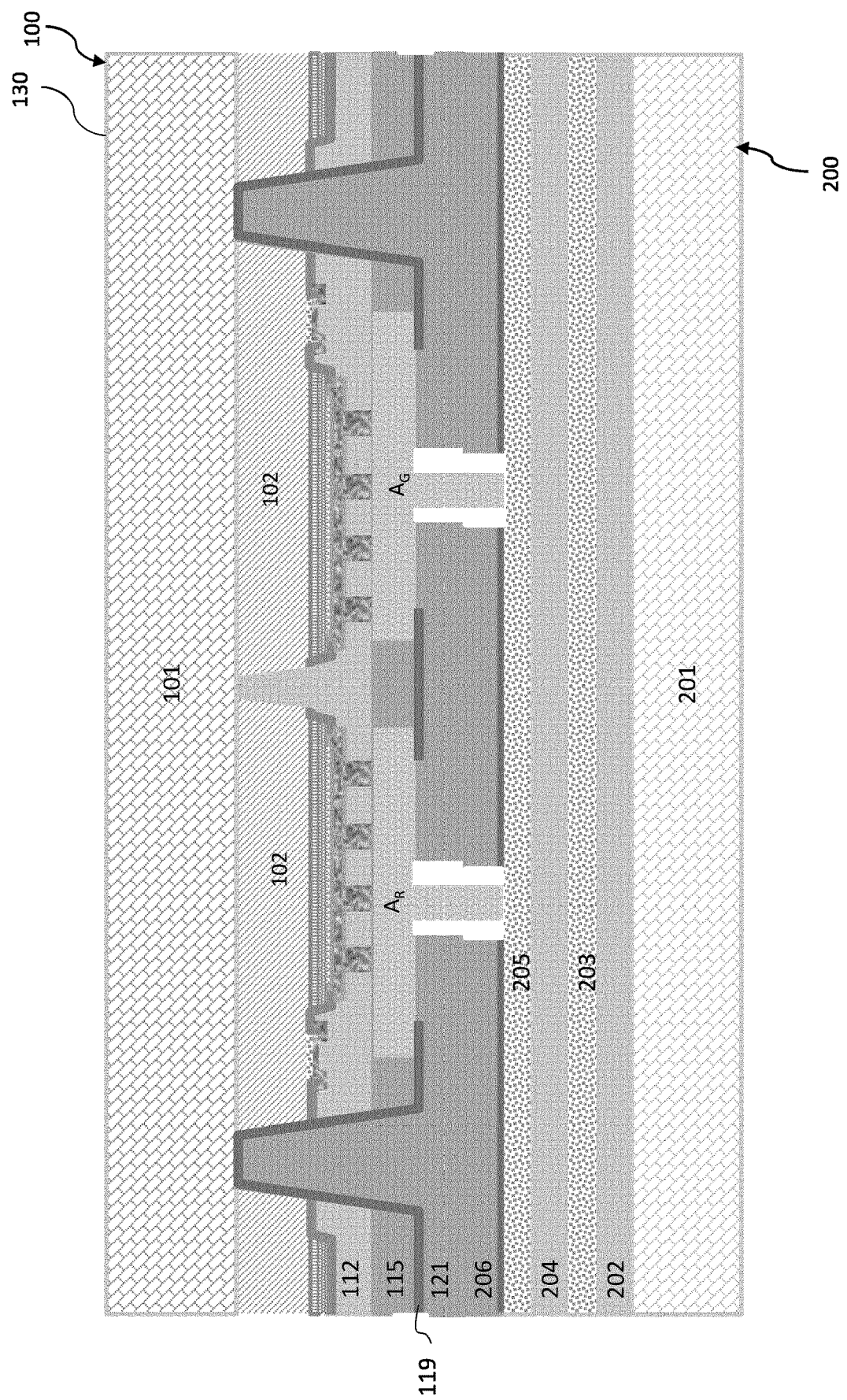
FIG. 14 shows a twelfth intermediate step in the method of forming a monolithic LED pixel according to an embodiment of this disclosure.

In such an embodiment electrical connections may be formed between the test substrate 200 and each of the monolithic LED pixels 1. Various methods for the formation of electrical connections between two substrates to be brought into contact with each other are known to the skilled person. One example of such a method according to the first embodiment is shown in FIGS. 13 and 14.

As shown in FIG. 13, a plurality of seventh openings 212 may be formed in the test substrate surface 210 of the test substrate 200. Each of the seventh openings extend from the test substrate surface 210 through to one or more of the electronics layers 205, 203 of the test substrate 200. The plurality of seventh openings 212 may each be aligned with one of the metal contacts of each of the LED subpixels 103. That is to say the arrangement of the seventh openings 212 on the test substrate 200 corresponds to the arrangement of the sixth openings 146 provided on the intermediate array of LED subpixels 100.

In some embodiments, for example as shown in FIG. 13, a plurality of conductive contact portions 208 may be formed within the seventh openings 212 of the test substrate 200. Each of the conductive contact portions 208 may extend from the electronics layers 203, 205 in a direction normal to the test substrate 200 beyond the test surface 210. As such, the conductive contact portions 208 may protrude from the test surface 210. The conductive contact portions 208 may be configured to extend from the test surface 210 in such a manner that when the test surface 210 is brought into contact with the bonding surface 121 the conductive contact portions 212 form an electrical connection between the various contact metallisations of the intermediate array of the LED subpixels 100 and the second contacts of the test substrate 200. In some embodiments, the conductive contact portions 208 may comprise a metallic contact, for example one or more of titanium, gold, copper or tin.

According to the method of forming the first embodiment of the disclosure, the test substrate 200 may be bonded to the bonding surface 221 of the sacrificial dielectric layer 121. FIG. 14 shows an example in which the test substrate 200 is bonded to the intermediate array of LED subpixels 100. The test substrate 200 may be bonded to the bonding surface 221 using an aligner bonder (not shown). The aligner bonder enables the bonding surface 221 to be arranged parallel to the test surface 210 and also that the conductive contact portions 212 of the test substrate 200 are aligned with the sixth openings 146 of the sacrificial dielectric layer 121. The aligner bonder is then configured to bring the two surfaces into contact whereby the sacrificial dielectric layer 121 forms a bond with the test substrate surface 210 of the test substrate 200. In some embodiments, the aligner bonder may apply one or more of heat and pressure to improve the bond formed between the test substrate surface 210 and the bonding surface 221.

For example, in some embodiments, the aligner bonder may apply a compressive force of at least 10 kN for bonding the test substrate 200 to the intermediate array of LED subpixels 100. In some embodiments, the aligner bonder may apply a compressive force of at least 20 kN, 30 kN, or 40 kN. By applying a larger compressive force, the reliability of forming the bond between substrates may be improved. In some embodiments, the press may apply a compressive force of no greater than 45 kN in order to reduce the risk of substrate fracture or other undesirable deformation of the substrates during bonding.

In some embodiments, the aligner bonder may also be configured to heat the test substrate 200 and/or the intermediate array of LED subpixels 100. For example, the aligner bonder may be configured to heat the test substrate 200 and/or the intermediate array of LED subpixels 100 to a temperature of at least 100° C. In some embodiments the aligner bonder may be configured to heat the test substrate 200 and/or the intermediate array of LED subpixels 100 to a temperature of at least: 200° C., 300° C., 400° C., or 500° C. The aligner bonder may be configured to hold the temperature under compression, and optionally at temperature for a time period. In some embodiments, the time period may be at least: 1 minute, 2 minutes, 5 minutes, 10 minutes or 1 hour. Accordingly, a press may be used to improve the formation of direct, fusion bonds at the interface between the test substrate 200 and the intermediate array of LED subpixels 100.

Various methods are known for bonding two substrates together. For example in the embodiment of FIG. 14 the sacrificial dielectric layer 121 forms a direct bond with the sacrificial test dielectric layer 206. In other embodiments, different bonding techniques and bonding layers may be provided on one or both of the test substrate 200 and/or the intermediate array of LED subpixels 100 in order to bond the test substrate 200 to the bonding surface 221. The aligner bonder may also be configured to form electrical connections between the conductive contact portions 212 and the first and second contacts of each LED subpixel 103.

In the first embodiment, as shown in FIG. 14, it will be appreciated that the sacrificial dielectric layer 121 and the sacrificial test dielectric layer 206 may extend as substantially continuous layers across the sacrificial substrate 101 and the electronics substrate 201 respectively. Accordingly, the sacrificial dielectric layer 121 and the sacrificial test dielectric layer 206 form direct bonds over a substantial portion of bonding surface of the intermediate array of LED subpixels 100 in order to bond the wafers together securely. In addition, low resistant contact bonds may be formed between the electronics layers 203, 205 of the test substrate 200 and each of the LED subpixels 30 through the conductive contact portions 208.

Once the intermediate array of LED subpixels 100 is bonded to the test substrate 200, the intermediate array of LED subpixels 100 may be tested. As such, each monolithic electronic device of the monolithic electronic device array may be test by supplying power from the test substrate 200 to the monolithic electronic device array (i.e. intermediate array of LED subpixels 100) via the plurality of first and second electrical contacts. The testing procedure is discussed in more detail below with reference to FIG. 29.

In addition to the testing procedure, the light emitting side of each monolithic LED pixel 1 may be further processed to separate each of the monolithic LED pixels 1 and to form light extraction features for each of the monolithic LED pixels 1. The testing procedure may be performed at any time prior to the removal of each of the monolithic LED pixels 1 from the test substrate 200.

Figure 15:
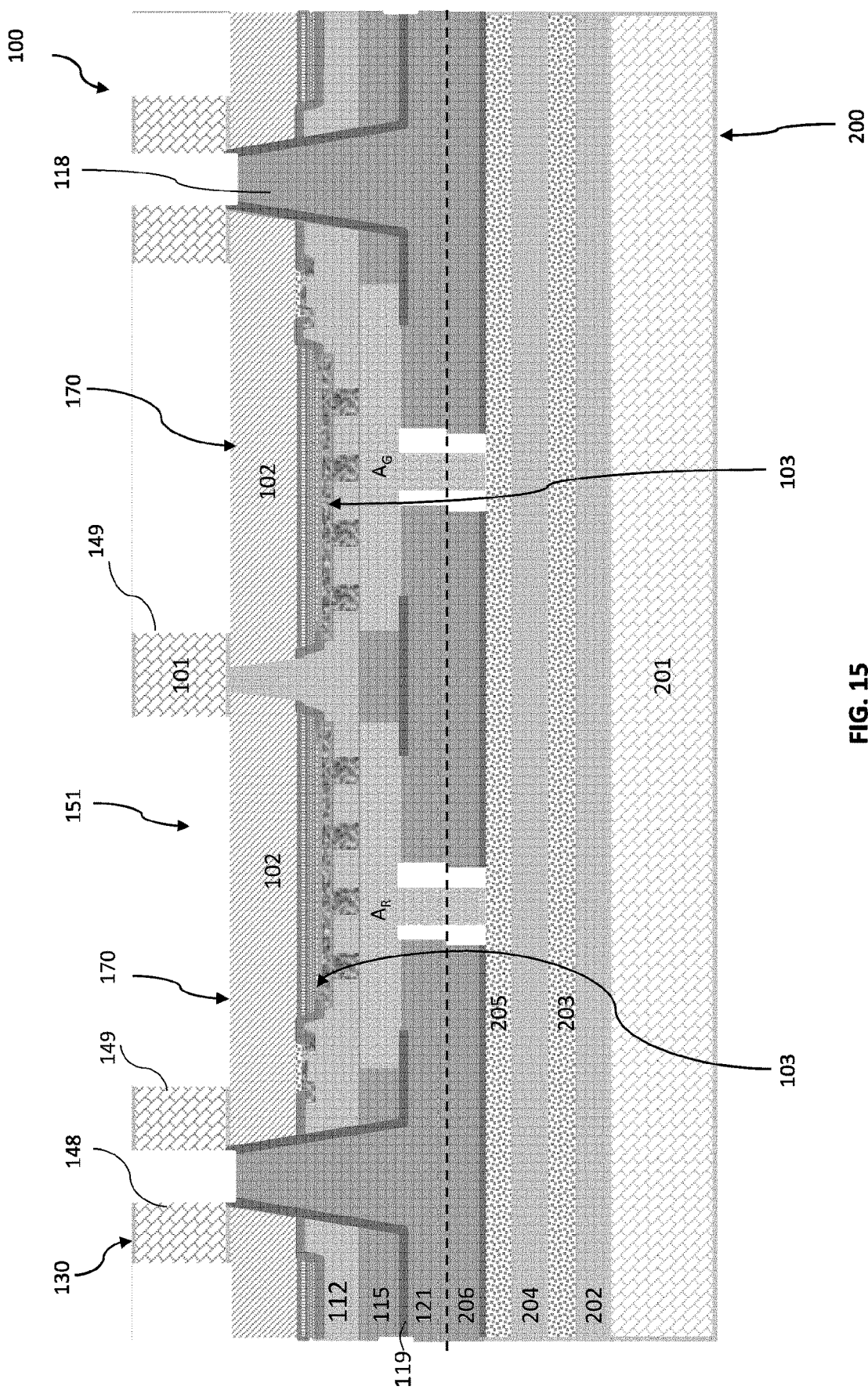
FIG. 15 shows a thirteenth intermediate step in the method of forming a monolithic LED pixel according to an embodiment of this disclosure.

Thus, the method of forming the first embodiment further comprises selectively removing first portions of the sacrificial substrate 101 through a thickness of the sacrificial substrate 101 aligned with the grid of pixel defining trenches 118 for separating each of the monolithic LED pixels. For example, as shown in FIG. 15, first portions of the sacrificial substrate 101 are removed to define a plurality of eighth openings 148 through the thickness of the sacrificial substrate 101 in a direction normal to the light emitting surface 130. The eight openings may be formed using any selective removal process known to the skilled person, for example a process comprising lithography and etching of the sacrificial substrate 101. The pixel defining trenches and first portions of the sacrificial substrate 101 encircle each monolithic LED pixel 1. Thus, by removing the first portions of the sacrificial substrate 101 aligned with the pixel defining trenches 118, the sacrificial substrate 101 no longer connects each of the monolithic LED pixels 1 together. Rather, the bond formed between the sacrificial dielectric layer 121 and the test substrate 200 acts to maintain the relative positions of each of the monolithic LED pixels 1 on the test substrate 200.

The method of forming the first embodiment also comprises forming light extraction features for each of the monolithic LED pixels 1. In some embodiments, the light extraction features for each of the monolithic pixels 1 may improve the efficiency of the light extracted from each of the monolithic LED pixels. In some embodiments, the light extraction features may modulate the light emitted by each of the monolithic LED pixels 1. For example, the light extraction features may provide one or more of the LED subpixels of a monolithic LED pixel 1 with a colour converting layer such that the monolithic LED pixel 1 may output light with at least two different (peak) wavelengths of light.

In some embodiments, for example as shown in FIG. 15, first light extraction features 151 for each subpixel of the monolithic LED pixels 1 are formed by selectively removing second portions of the sacrificial substrate 101 aligned with each of the LED subpixels 103.

The second portions of the sacrificial substrate 101 may be selectively removed through a thickness of the sacrificial substrate 101 in a direction normal to the light emitting surface 130. As such, second portions of the sacrificial substrate 101 are removed to define a plurality of ninth openings 149 through the thickness of the sacrificial substrate 101. By removing the second portions of the sacrificial substrate 101 the light emitting regions of each LED subpixel 103 may be able to output light more efficiently via the light emitting surface 130.

Each of the second portions of the sacrificial substrate 101 to be selectively removed are aligned with each of the LED subpixels 103. As such, each monolithic LED pixel 1 may have a plurality of second portions of the sacrificial substrate 101 selectively removed to define a plurality of ninth openings 149 through the thickness of the sacrificial substrate 101. The number of second portions selectively removed corresponds to the number of LED subpixels 103 for each monolithic LED pixel 1. As shown in FIG. 15, the area of the ninth openings 149 may be at least as large as the emitting area of each LED subpixel.

Accordingly, the light generated by each LED subpixel may be directed through the respective ninth opening 149 of each LED subpixel.

As shown in FIG. 15, the remaining portions of the sacrificial substrate 101 effectively separate each of the light emitting surfaces of each LED subpixel from the other light emitting surfaces of the other LED subpixels 103. Accordingly, in some embodiments the remaining portions of the sacrificial surface 101 may reduce or eliminate cross-talk between the LED subpixels.

In the embodiment of FIG. 15, the second portions of the sacrificial substrate 101 may be selectively removed in order to form a container volume 151 for each LED subpixel. As such, the container volumes may correspond to the plurality of ninth openings 149 shown in FIG. 15. The container volumes 151 may be a volume defined by the ninth openings 149 formed through the sacrificial dielectric layer 101 and the exposed first portion 170 of the surface of the common semiconducting layer 102. Each of the container volumes 151 may be provided to provide a volume in which a colour converting layer may be provided.

Figure 16:
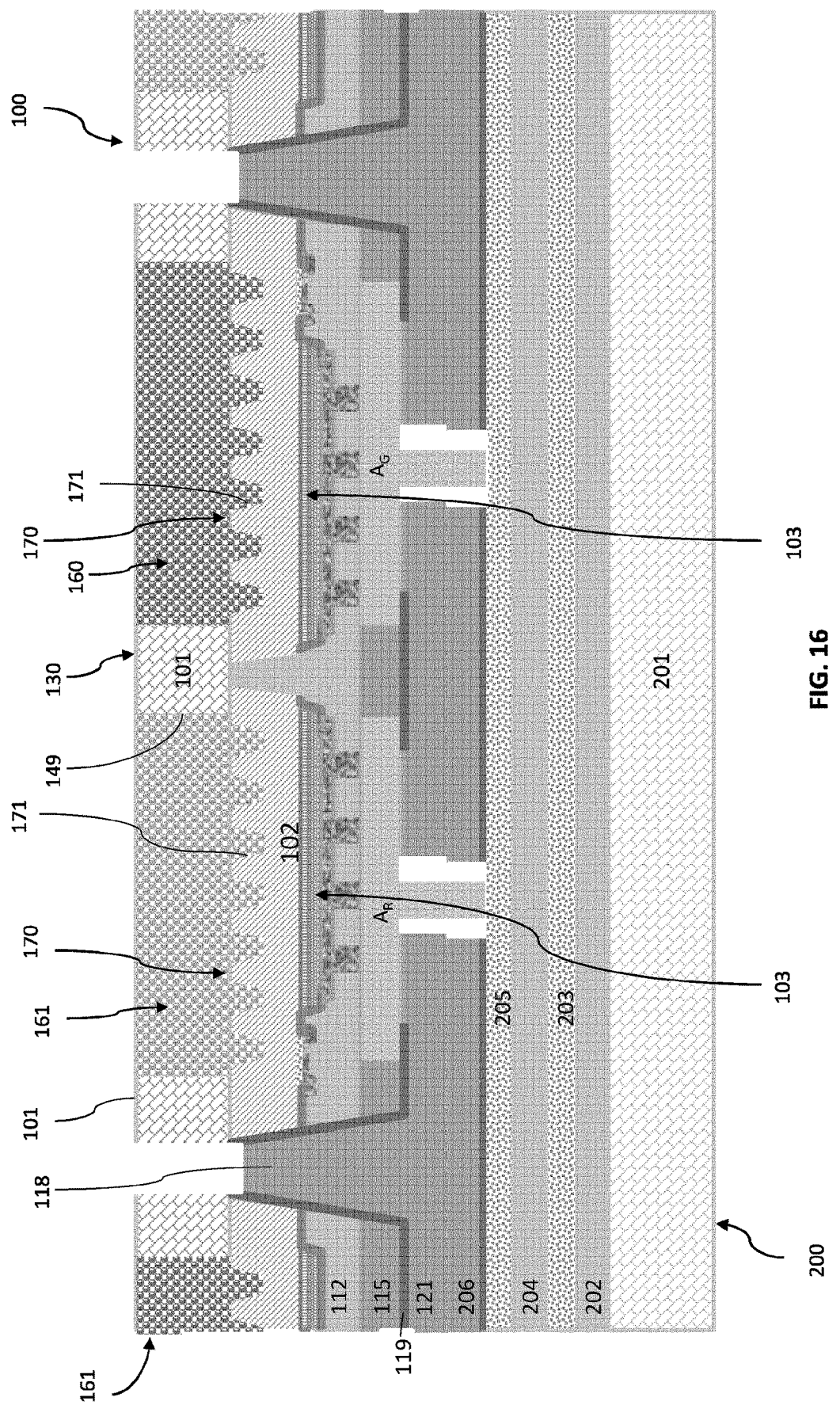
FIG. 16 shows a fourteenth intermediate step in the method of forming a monolithic LED pixel according to an embodiment of this disclosure.

In some embodiments, for example as shown in FIG. 16 a first colour converting layer 160 may be provided in at least one of the container volumes 151 of each monolithic LED pixel 1. The first colour converting layer 160 may be configured to absorb light of a first wavelength and emit converted light of a first converted light wavelength which is longer than the first wavelength. As such, the first colour converting layer 160 may be provided to convert light emitted by the LED subpixel over which it is provided into light of a different, longer wavelength.

In some embodiments, the first colour converting layer 160 may comprise a phosphor, an organic molecule, or a plurality of quantum dots. For LED subpixels arrays having container volumes with a surface area in excess of 1 mm$^2$, the larger particle size of phosphors may be advantageous. For LED subpixels having container volumes with surface areas less than 1 mm$^2$, for example a monolithic micro LED pixel, it may be advantageous to use a colour converting layer comprising quantum dots, due to the smaller particle size. Colour converting materials, including quantum dots are known to the skilled person. Further details of suitable quantum dots for use as a colour converting layer may be found in at least "Monolithic Red/Green/Blue Micro-LEDs with HBR and DBR structures" Guan-Syun Chen, et. al.

In some embodiments, the first colour converting layer 160 may completely fill the container volume 151 of the LED subpixel. In other embodiments, the first colour converting layer 160 may partially fill the container volume of the LED subpixel. For example as shown in FIG. 16, the first colour converting layer 160 substantially fills the entire volume of the first container volume.

In some embodiments, the first colour converting layer may be configured to convert light having a first wavelength of around 380 nm to 490 nm to first to converted light having a first converted light wavelength of at least 500 nm to 650 nm. That is to say, the first colour converting layer 160 may be configured to convert the substantially blue visible light generated by an LED subpixel 103 into substantially green visible light to be output by said LED subpixel.

In some embodiments, for example as shown in FIG. 16, each monolithic LED pixel 1 may further comprise a second colour converting layer 161. The second colour converting layer 161 may be provided in at least one other of the container volumes of each monolithic LED pixel 1. The second colour converting layer 161 may be configured to absorb light of the first wavelength and emit converted light of a second converted light wavelength which is longer than the first converted light wavelength. As such, the second colour converting layer 161 may be provided in addition to the first colour converting layer 160 in order to provide a further colour of light for the monolithic LED pixel 1. That is to say, a monolithic LED pixel 1 comprising: an LED subpixel with no colour converting layer, a LED subpixel comprising a first colour converting layer 160, and an LED subpixel comprising a second colour converting layer 161 may output light comprising three different peak wavelengths. For example in the embodiment of FIG. 16 the monolithic LED pixel 1 may be configured to output visible light which includes substantially red green and blue components.

The second colour converting layer 161 may comprise a phosphor or a plurality of quantum dots. As such, the second colour converting layer 161 may be formed in a similar manner to the first colour converting layer 160. In some embodiments, the second colour converting layer may be configured to convert first light having a wavelength of at least 380 nm and up to 490 nm into second converted light having a second converted light wavelength of at least 550 nm and no greater than 680 nm.

Referring back to the diagrams of FIGS. 1 and 2, it will be appreciated that the cross-section shown in FIGS. 3 to 16 shows two of the three LED subpixels included within the monolithic LED pixel 1. As such, it will be appreciated that the other LED subpixel (not shown in FIG. 16) may not include a first or second colour converting layer 160, 161.

In some embodiments, a container volume 151 comprise a light scattering medium (not shown) in place of a colour converting layer. For example, in the embodiment shown in FIG. 1, the B subpixel is configured to emit light having the first wavelength. As such, the container volume 151 for the B subpixel does not include a colour converting layer 160, 161. In the embodiment of FIG. 1, the container volume 151 of the B pixel includes a light scattering medium. The light scattering medium may be configured to scatter light such that the light output by the B pixel may have a Lambertian light distribution, or a full width half max (FWHM) of 120 degrees (or wider). As such, the light scattering medium may be provided to improve the light extraction efficiency and the viewing angle of the light emitted from the B LED subpixel.

In some embodiments, the second portions of the sacrificial substrate 101 may be selectively removed through the thickness of the sacrificial substrate such that first portions 170 of the surface of the common semiconducting layer 102 are exposed. In some embodiments, for example as shown in FIG. 16 third light extraction features may be formed for each of the monolithic LED pixels 1. The third light extraction features may be formed by patterning first portions 170 of the surface of the common semiconducting layer 102 to form light scattering features 171 configured to increase a light extraction efficiency of each LED subpixel.

For example, in the embodiment of FIG. 16 the light scattering features 171 are formed by selectively removing regions of the first portions 170 of the common semiconducting layer 102 to form a textured surface. The provision of a textured surface at the interface between the common semiconducting layer 102 and each of the container volumes may help reduce total internal reflection occurring at the interface between the common semiconducting layer 102 and the container volumes 151. As such the light scattering features 171 formed by the patterning of the first portions 170 of the surface of the common semiconducting layer 102 are configured to increase a light extraction efficiency of each LED subpixel. That is to say the amount of light output by each LED subpixel may be increased by reducing the proportion of light reflected at the interface between the common semiconducting layer 102 and the container volume. Whilst in the embodiment of FIG. 16 a selective removal process is used to pattern the first portions 170 of the surface of the common semiconducting layer 102, in other embodiments an anti-reflection coating may be provided or other similar optical coatings aimed at improving light extraction efficiency from a light emitting diode.

Figure 17:
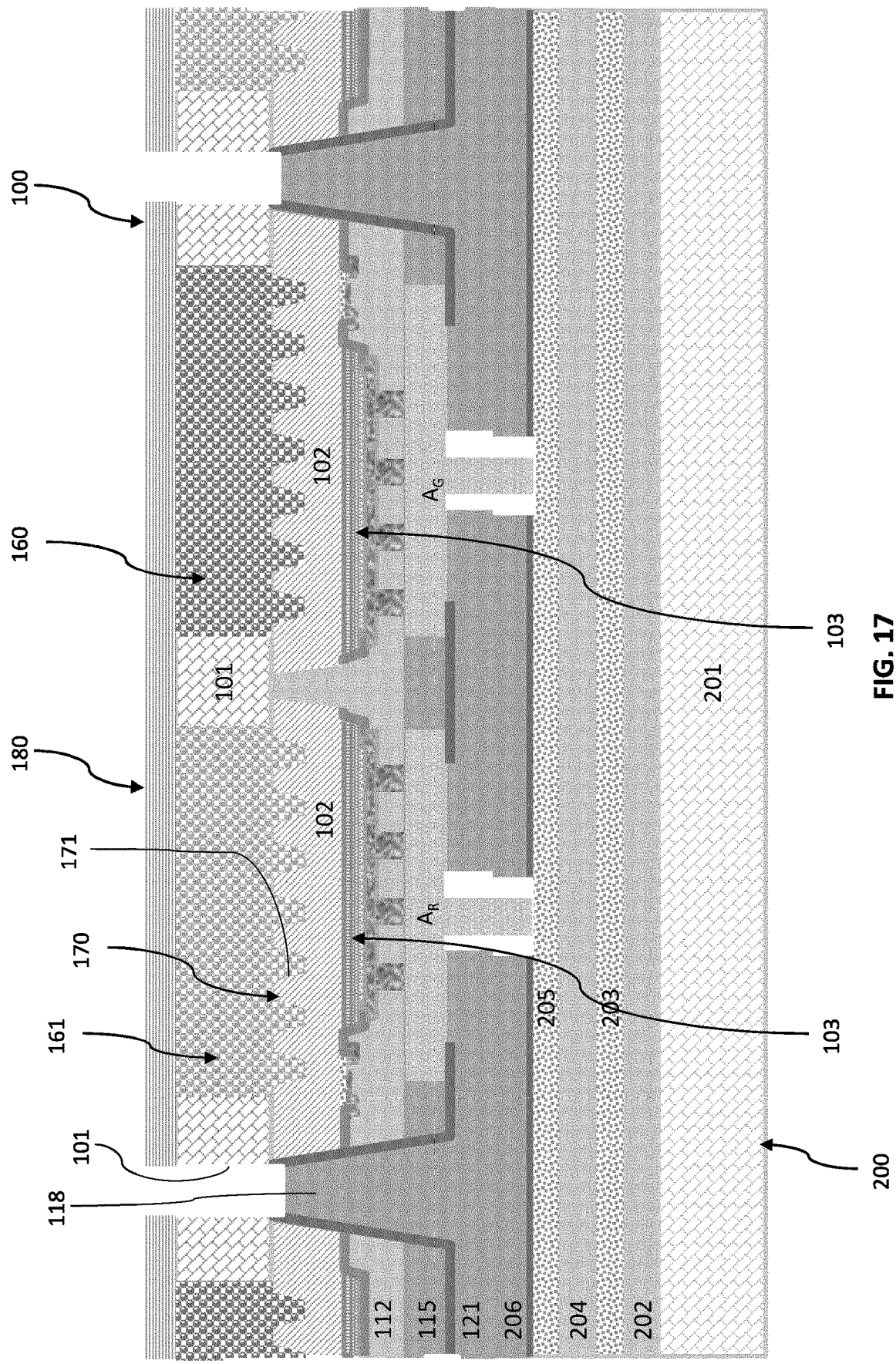
FIG. 17 shows a fifteenth intermediate step in the method of forming a monolithic LED pixel according to an embodiment of this disclosure.

In some embodiments, for example as shown in FIG. 17, a pump light reflector laminate 180 may be provided over some of the LED subpixels of each monolithic LED pixel 1. The pump light reflector laminate may be provided over the container volumes of LED subpixels comprising first and/or second colour converting layers 160, 161. The pump light reflector laminate may be configured to absorb pump light of a first wavelength and to transmit light having wavelengths of the first and/or second wavelength colour converted wavelength. Effectively, the pump light reflector laminate is a band stop filter which is configured to have a narrow wavelength stop band which is includes the wavelength of the first wavelength and a passband which includes the first and/or second converted light wavelengths.

One example of a suitable pump light reflector laminate may be a distributed Bragg reflector. Examples of suitable distributed Bragg reflectors may be found in U.S. Ser. No. 11/508,166. Of course it will be appreciated that for LED subpixels not including a colour converting layer (i.e. LED subpixels emitting the first wavelength, the pump light reflector laminate may not be provided over said LED subpixels). In the embodiment of FIG. 17, one pump light reflector laminate 180 is provided across the container volumes 151 including the first and second colour converting layer 160, 161. For example, in the embodiment of FIG. 17, the pump light reflector laminate may comprise alternating layer of $TiO_2$ (refractive index of about 2.6), and $SiO_2$ (refractive index of about 1.5). In other embodiments, different pump light reflector laminates may be provided for each of the container volumes 151.

Figure 18:
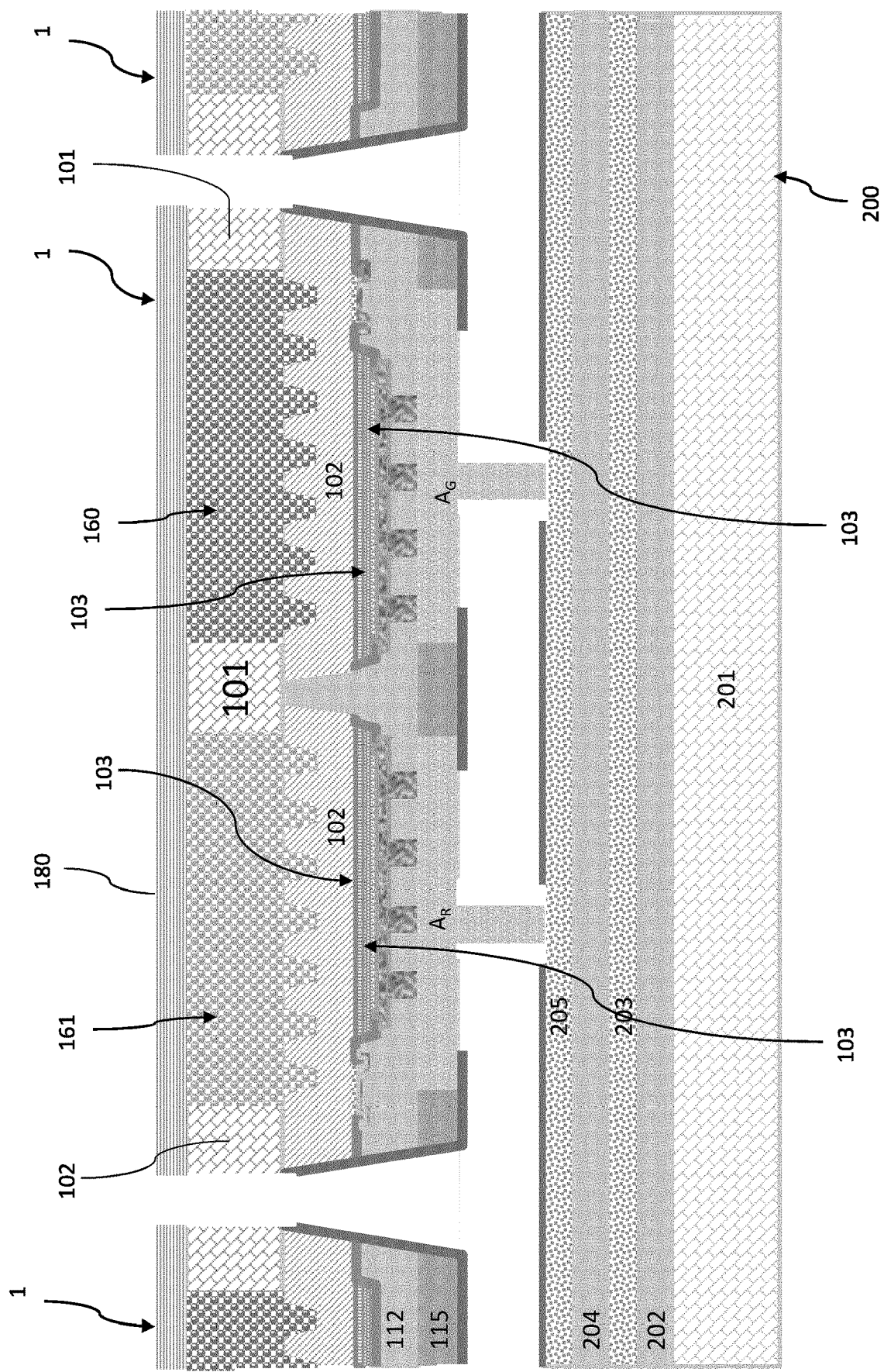
FIG. 18 shows a sixteenth intermediate step in the method of forming a monolithic LED pixel according to an embodiment of this disclosure.

Following the formation of the light extraction features, the sacrificial dielectric layer 121 may be selectively removed in order to separate each monolithic LED pixel 1 from the test substrate 200. For example, as shown in FIG. 18 the sacrificial dielectric layer 121 has been selectively removed. In accordance with the method of fabricating the first embodiment, the sacrificial test dielectric layer 206 has also been selectively removed. The etch stop layer 119 and the test etch stop layer 207 provide surfaces on which the selective removal process may more reliably terminate in order to protect the other layers of the monolithic LED pixels 1 and the test substrate 200.

It will be appreciated that following the removal of the sacrificial dielectric layer 121, each monolithic LED pixel includes a light emitting surface 130, and a planarised dielectric surface 217. The light emitting surface 130 and the planarised dielectric surface are separated by sidewalls defined by sidewall surfaces of the planarising dielectric layer, the common semiconducting layer, and the sacrificial substrate. These sidewall surfaces are formed as a result of the earlier etching process performed during the method of forming the monolithic LED pixels 1. As such, the planarising dielectric layer, the common semiconducting layer, and the sacrificial substrate define etched sidewalls surrounding a light emitting surface for each of the monolithic LED pixels 1.

As shown in FIG. 18, following the removal of the sacrificial dielectric layer 121, the monolithic LED pixels 1 may still be connected to the test substrate by the plurality of conductive contact portions 208. It will be appreciated that the connections between the conductive contact portions 208 and each of the monolithic LED subpixels 1 may be relatively weak. Accordingly as shown in FIG. 18 the monolithic LED subpixels 1 may each be lifted off from the test substrate causing the contact between the conductive contact portions 208 and the monolithic LED pixels 1 to fracture. For example, a pick and place mass transfer machine may remove each of the monolithic LED pixels in turn 1. The spacing between each monolithic LED pixel 1 following the removal of the sacrificial dielectric layer 121 may provide space for a pick and place mass transfer machine to more easily manipulate each monolithic LED pixel 1.

Thus, according to a first embodiment of the disclosure, a monolithic LED pixel 1 is provided. The LED pixel 1 comprises a sacrificial substrate 101, a common semiconducting layer 102, and array of LED subpixels, and a planarising dielectric layer. The common semiconducting layer 102 comprises a Group III-nitride provided on the sacrificial substrate 101. The array of LED subpixels is provided on the surface of the common semiconducting layer 102 on an opposite side of the common semiconducting layer 102 to the sacrificial substrate 101. Each LED subpixel of the array of LED subpixels comprises a stack of Group III-nitride layers. The planarising dielectric layer provided on the array of LED subpixels provides a planarised dielectric surface 217 which is generally aligned with the surface of the common semiconducting layer 102. The planarising dielectric layer, the common semiconducting layer 102, and the sacrificial substrate 101 define etched sidewalls surrounding a light emitting surface of the monolithic LED pixel 103. The monolithic LED pixel 1 further comprises light extracting features comprising first openings provided through a thickness of the sacrificial substrate aligned with each of the LED subpixels.

Figure 19:
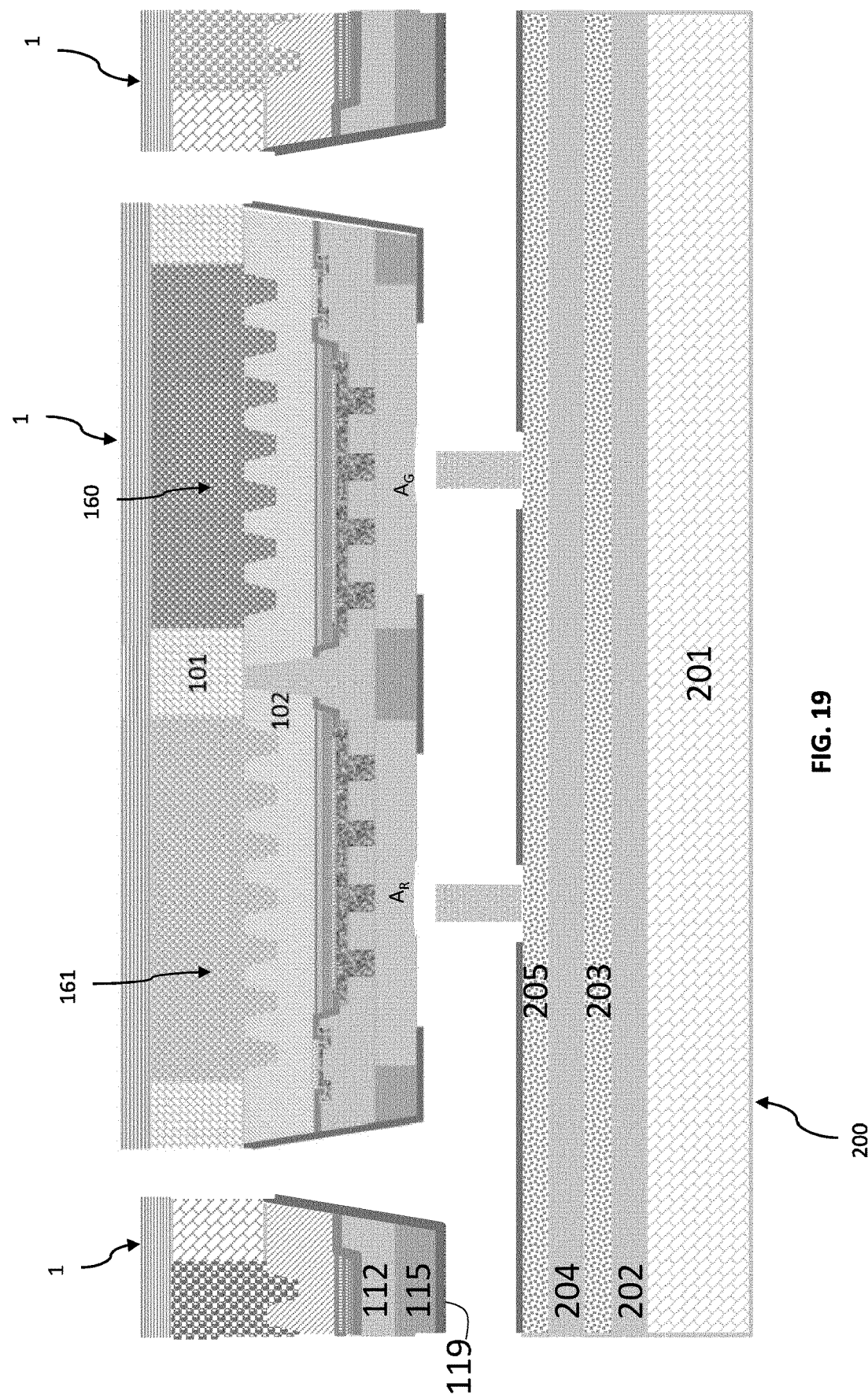
FIG. 19 shows a monolithic LED pixel according to an embodiment of this disclosure.

An example of a monolithic LED pixel 1 according to the first embodiment is shown in FIGS. 1 and 2. A cross section of the monolithic LED pixel 1 along line A-A' is shown in FIG. 19. The further features of the monolithic LED pixel 1 will be apparent from the functionality of the various layers discussed above with respect to the method of forming the monolithic LED pixel 1 of the first embodiment.

Next, a description of the method of forming the monolithic LED pixel 1 according to the first embodiment will be provided with reference to a cross-section along line B-B' shown in FIG. 2.

As shown in the plan view of FIG. 2, the monolithic LED pixel 1 comprises four contact metallisations 117. Three of the contact metallisations 117 are anode contact metallisations, $A_R$, $A_G$, $A_B$, one for each of the three LED subpixels 103. As such, the monolithic LED pixel includes 1 shown in FIG. 2 includes one anode contact metallisation $A_R$, $A_G$, $A_B$, for each of the red, green and blue LED subpixels R, G, B. Each of the anode contact metallisations $A_R$, $A_G$, $A_B$, is configured to form an electrical connection to a respective anode of the three LED subpixels 103 R, G, B.

Further, as shown in FIG. 2, the monolithic LED pixel 1 includes a common cathode contact metallisation $C_C$. The common cathode contact metallisation $C_C$ is configured to provide an electrical connection to each of the cathodes of the LED subpixels 103. As such, the common cathode contact metallisation $C_C$ may be provided with a single contact point to the common semiconducting layer 102, or in some embodiments, such as in the first embodiment, a plurality of contact points to the common semiconducting layer. Accordingly, the monolithic LED pixel 1 may be provided with a common cathode contact metallisation $C_C$ and an anode contact metallisation $A_R$, $A_G$, $A_B$ for each LED subpixel such that each of the LED subpixels R, G, B may be controlled independently from the other LED subpixels R, G, B.

As shown in FIG. 2, the contact metallisations $C_C$, $A_R$, $A_G$, $A_B$ are provided in a layer such that the monolithic LED pixel 1 may be mounted on a further substrate as part of a pick and place process. Furthermore, in order to integrate the common cathode contact metallisation $C_C$ into the monolithic LED pixel 1, the common cathode may be arranged to overlap with one or more of the LED subpixels. An example of such an arrangement will now be described with reference to a cross-section along line B-B' shown in FIG. 2.

Figure 20:
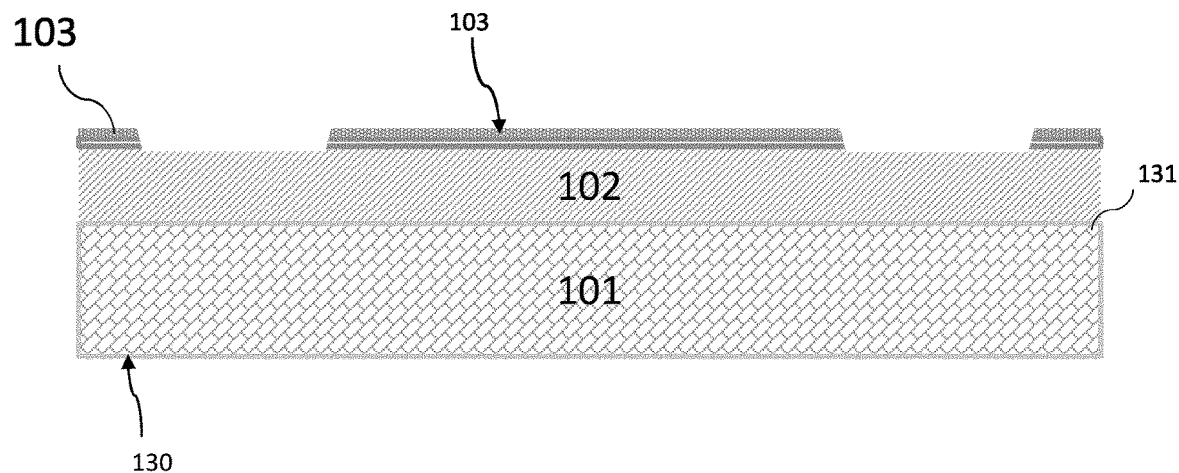
FIG. 20 shows a cross-section of an intermediate step along line B-B' corresponding to the intermediate step of FIG. 4.

FIG. 20 shows an intermediate step of the method of forming the first embodiment of the disclosure along the line B-B'. As shown in FIG. 20 a sacrificial substrate 101 is provided. A common semiconducting layer 102 is provided on the sacrificial substrate 101. A plurality of LED subpixels 103 are then formed on the common semiconducting layer 102. As such, the diagram of FIG. 20 is an alternate view of the diagram shown in FIG. 4 of this disclosure. It will be appreciated from the diagram of FIG. 20 and FIG. 1 that the LED subpixel 103 shown in FIG. 20 has a different surface area to the other LED subpixels 103 of the monolithic LED pixel 1. For example, the LED subpixel G shown in FIG. 20 is at least twice the surface area of the other LED subpixels R, B of the monolithic LED pixel 1. The increase in surface area of the LED subpixel G is provided by elongating one dimension of the LED subpixel G aligned with the surface of the common semiconducting layer 102 relative to the other LED subpixels R, B. That is to say the LED subpixel 103 shown in FIG. 20 is a different size to the other LED subpixels 103 forming the monolithic LED pixel 1. In the first embodiment, the LED subpixel 103 G configured to output substantially green visible light is provided as the largest of the three LED subpixels 103.

Figure 21:
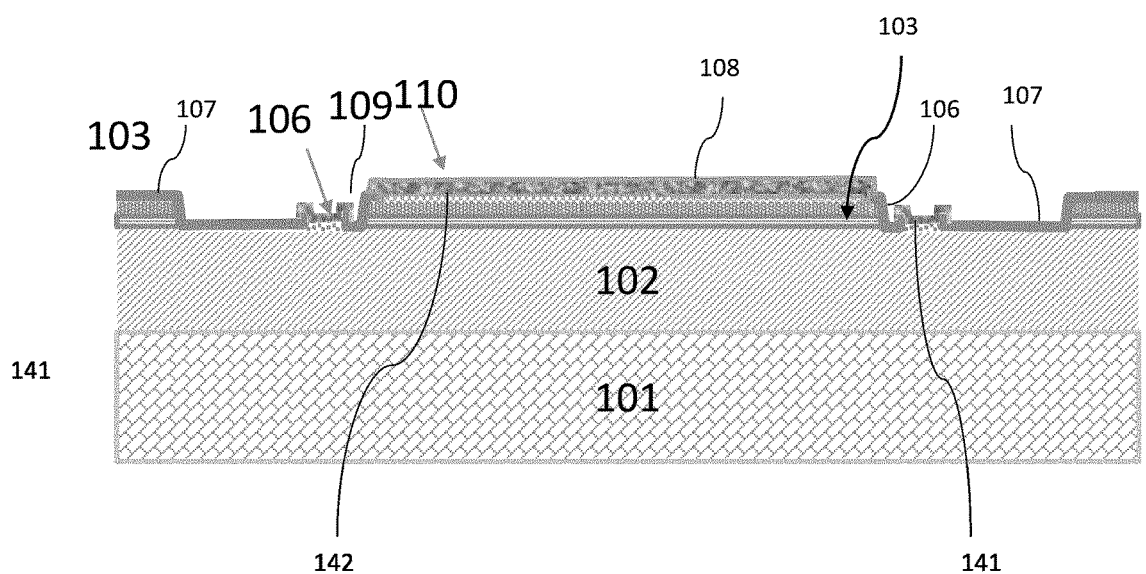
FIG. 21 shows a cross-section of an intermediate step along line B-B' corresponding to the intermediate step of FIG. 5.

Next, as shown in FIG. 21 a plurality of first contact layers 106 are formed on the common semiconducting layer 102 in regions between the LED subpixels 103. The first contact layers 106 are configured to provide an electrical connection to the common semiconducting layer 102. As shown in FIG. 20 a plurality of first contacts layers are provided one on either side of the LED subpixel 103.

Further, a first passivation layer 107 is formed over the plurality of LED subpixels 103. A plurality of first openings 141 are formed in the first passivation layer 107 which are aligned with each of the first contact layer 106. A cathode contact layer 109 is then formed within the first openings 141 of the first passivation layer 107. As such, the cathode contact layer 109 is provided on each of the first contact layers 106. A plurality of second openings 142 are also formed in the first passivation layer 107. Each of the second openings is aligned with one of the LED subpixels 103. An anode contact layer 108 is formed in the plurality of second openings 142 to form electrical connections to the anodes of each of the LED subpixels 103. As such, the intermediate structure shown in FIG. 21 is an alternate view of the intermediate structure shown in FIG. 5.

Figure 22:
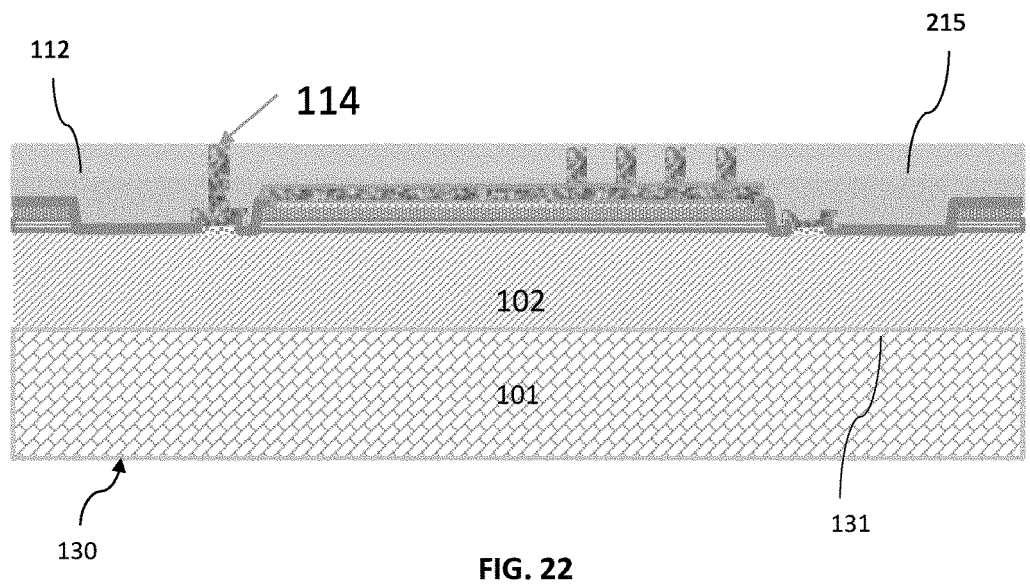
FIG. 22 shows a cross-section of an intermediate step along line B-B' corresponding to the intermediate step of FIG. 7.

Following the formation of the cathode contact layer 109 and the anode contact layers 108, the planarising dielectric layer is formed. As discussed above, part of the process of forming the planarising dielectric layer includes the formation of contact metallisations 117 to allow electrical connections to be made to each of the LED subpixels 103 for each monolithic LED pixel 1. As shown in FIG. 22, the planarising dielectric layer may be built up from a plurality of passivation layers. For example as shown in FIG. 22 a second passivation layer 112 is formed over the array of LED subpixels 103. A plurality of third openings 143 may then be formed in the second passivation layer 112 to allow for the formation of first contact metallisations 114 to form electrical connections to the anode contact layers 108 and the cathode contact layers 109. As shown in FIG. 22 a plurality of first contact metallisations 114 are provided in the third openings 143. As shown in FIG. 22 a plurality of first contact metallisations 114 extend through the second passivation layer 112 to the anode contact layer 108, and a further first contact metallisation 114 extends through the second passivation layer 112 to the cathode contact layer 109.

Figure 23:
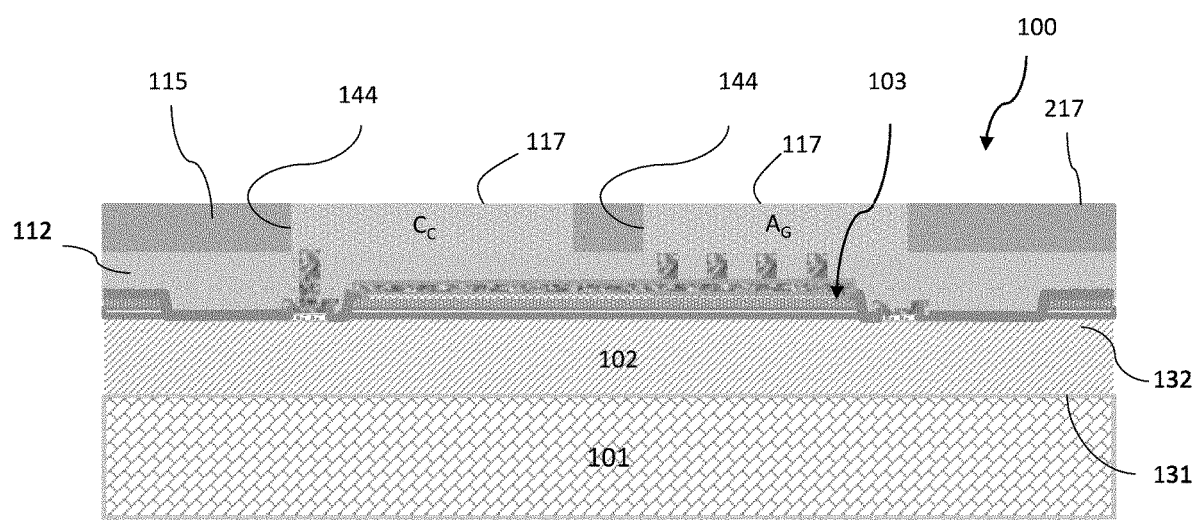
FIG. 23 shows a cross-section of an intermediate step along line B-B' corresponding to the intermediate step of FIG. 9.

Next, as shown in FIG. 23 a third passivation layer 115 is formed over the second passivation layer 112. Fourth openings 144 are formed in the third passivation layer 115. The fourth openings 144 define regions of the third passivation layer in which the second contact metallisations 117 are to be provided for each electrical contact to each LED subpixel 103 and the common cathode. As shown in the embodiment in FIG. 23, the common cathode contact metallisation $C_C$ is provided within a fourth opening 144 of the third passivation layer 115 which overlaps with the LED subpixel 103 in a plane normal to the common semiconducting layer 102. By providing the common cathode contact metallisation $C_C$ overlapping with one or more of the LED subpixels, the common cathode contact metallisation may be provided in a more space efficient manner within the monolithic LED pixel 1. That is to say the common cathode contact metallisation $C_C$ overlaps a portion of a light emitting surface of the monolithic LED pixel 1. Consequently, a greater proportion of the light emitting surface 130 of the monolithic LED pixel is taken up by the light emitting elements of each LED subpixel rather than non-emitting surface portions which would otherwise need to be provided to provide room for the common cathode contact metallisation $C_C$.

As also shown in FIG. 23 an anode contact metallisation $A_G$ is provided in another of the fourth openings 144 to form an anode contact metallisation for the LED subpixel G shown in FIG. 23. Accordingly, first electrical contacts are provided for each of the LED subpixels. As shown in FIG. 23, each LED subpixel is provided with an anode first electrical contacts and a common cathode first electrical contact for each monolithic LED pixel. Of course, in other embodiments, the number of first electrical contacts will depend on the specific features of the monolithic electronic device.

It will be appreciated that the structure shown in FIG. 23 is the same intermediate structure as shown in FIG. 9 of this disclosure, viewed along line B-B'. As such it will be appreciated that the third passivation layer 115 and the cathode and anode contact metallisations form a planarised dielectric surface for the monolithic LED pixel 1.

Figure 24:
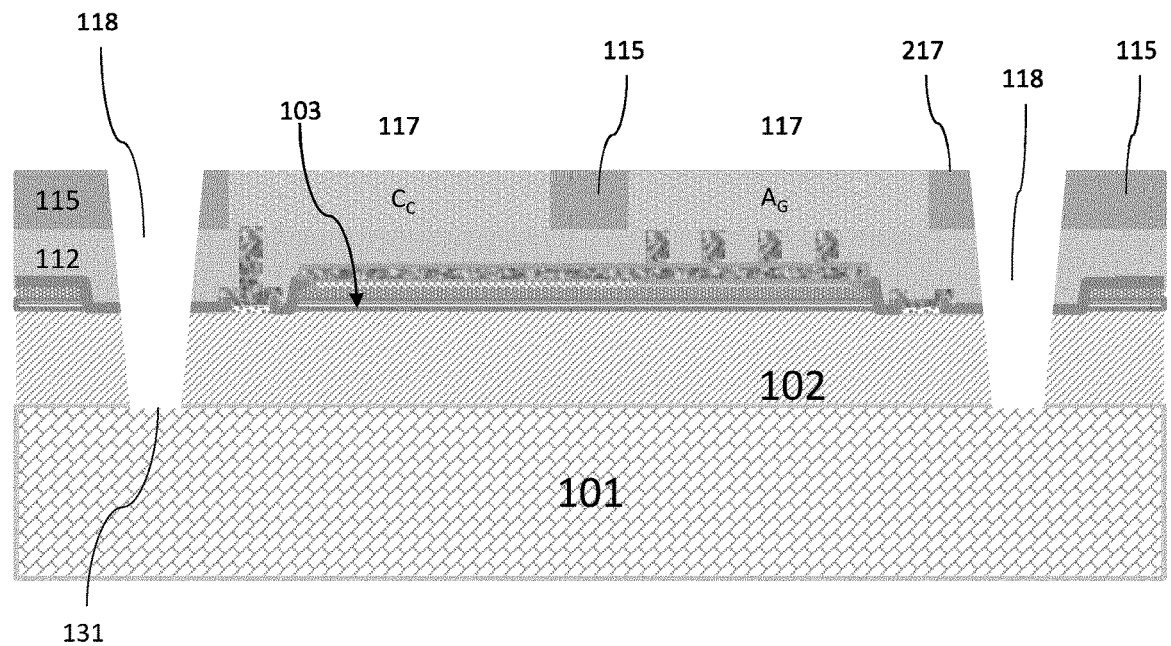
FIG. 24 shows a cross-section of an intermediate step along line B-B' corresponding to the intermediate step of FIG. 10.
Figure 25:
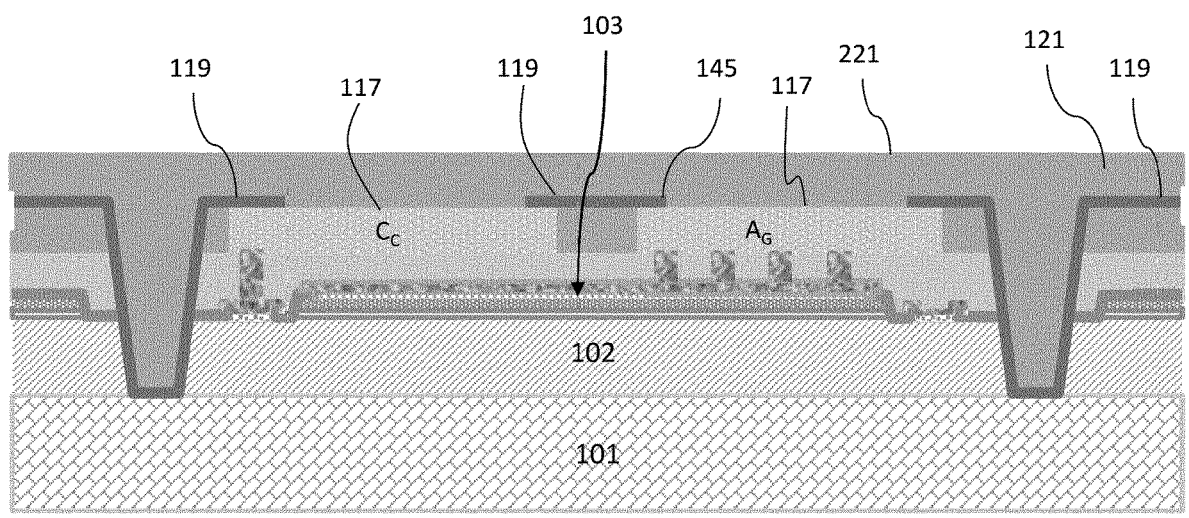
FIG. 25 shows a cross-section of an intermediate step along line B-B' corresponding to the intermediate step of FIG. 10 further including the sacrificial dielectric layer.
Figure 26:
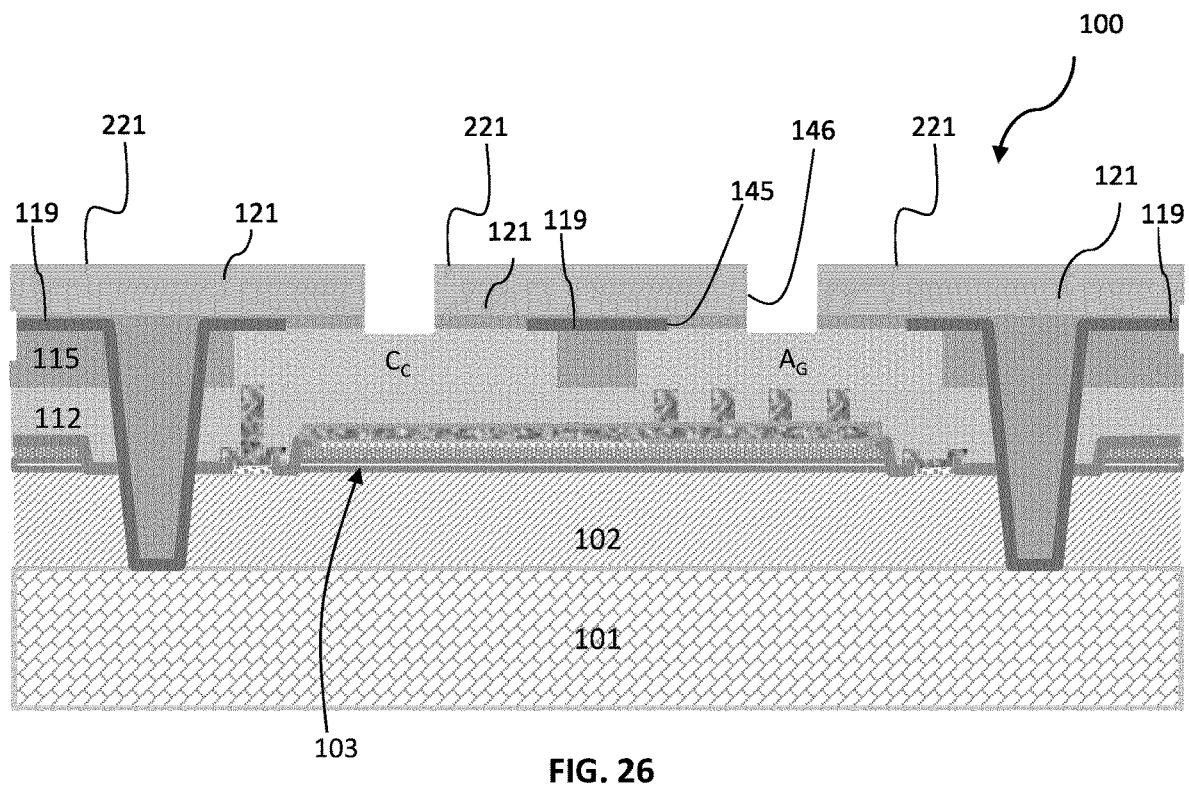
FIG. 26 shows a cross-section of an intermediate step along line B-B' corresponding to the intermediate step of FIG. 11.

Following the formation of the anode and cathode contact metallisations, the method of forming a monolithic LED pixel 1 continues as described above in relation to FIGS. 10 and 11. Thus, as shown in FIG. 24, the pixel defining trenches 118 are formed. In FIG. 25, the etch stop layer 119 and the sacrificial dielectric layer 121 are formed over the pixel defining trenches 118 and the planarising dielectric layer in order to form the intermediate array of LED subpixels 100 as described above in relation to FIGS. 3 to 11.

Figure 27:
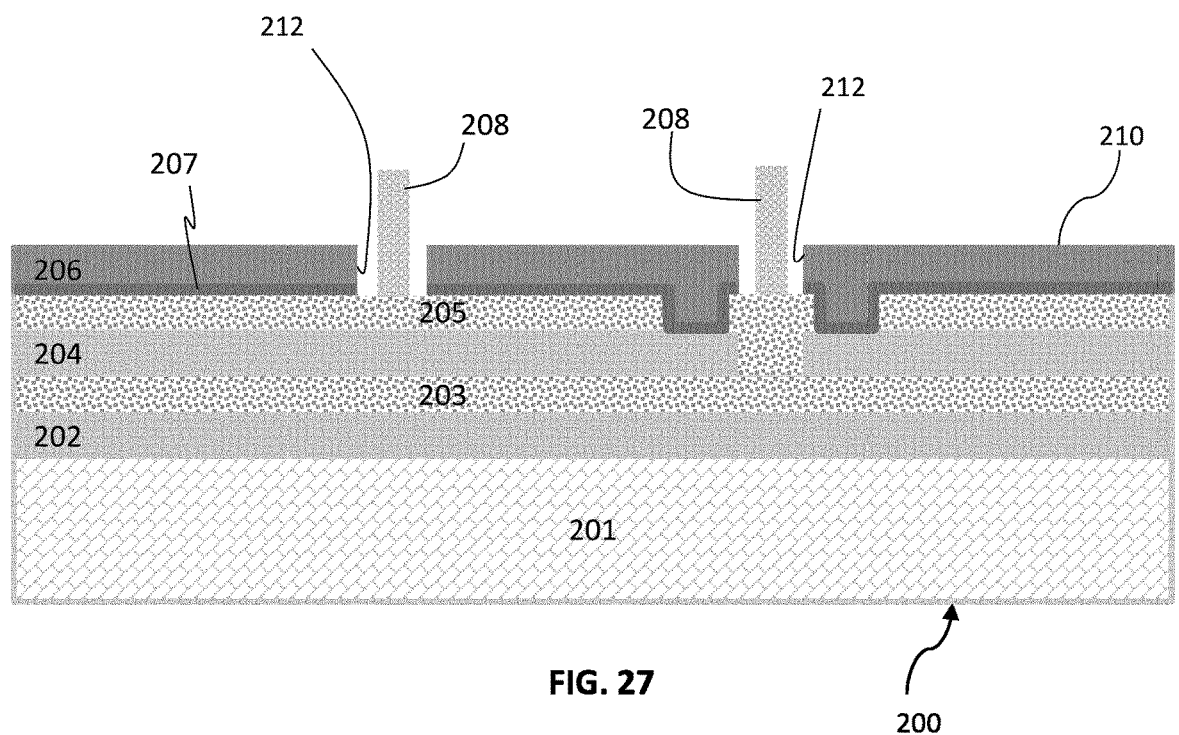
FIG. 27 shows a cross-section of an intermediate step along line B-B' corresponding to the intermediate step of FIG. 13.

Next, the intermediate array of LED subpixels 100 is bonded to the test substrate 200 as discussed above. FIG. 27 shows a cross-section of the test substrate 200 corresponding to the portion of the test substrate to be aligned with line B-B' of the monolithic LED pixel 1. As such, the test substrate 200 includes an electronics substrate 201 and a plurality of electronics layers 202, 203, 204, 205. In the first embodiment the test substrate 200 also includes a test etch stop layer 207 and a sacrificial test dielectric layer 206.

As shown in FIG. 27, the test substrate 200 is configured to testing each of the monolithic LED pixels 1. As shown in FIG. 27, the plurality of electronics layers 202, 203, 204, 205 are arranged to provide electrical connections to the anode contact metallisations $A_G$ $A_B$ $A_R$, and the cathode contact metallisation $C_C$.

For example the test substrate 200 comprises a first conductive layer 203, and a second conductive layer 205. Each of the conductive layers may comprise an electrically conductive material, for example a metal such as gold, aluminium, copper, and the like.

The test substrate may also comprise a first insulating layer 202 and a second insulating layer 204. The first and second insulating layers 202, 204 may comprise any suitable dielectric material, for example silicon dioxide. The first insulating layer 202 may provide a surface on which the first conductive layer 203 may be provided. The second insulating layer 204 may then be provided over the first conductive layer 203 in order to encapsulate the first conductive layer 203. The second conductive layer 205 may then be formed over the second insulating layer 204. As such, the stack of electronics layers 202, 203, 204, 205 may be formed in a pattern to provide electrical connections to each of the anode contact metallisations $A_G$ $A_B$ $A_R$, and the cathode contact metallisation $C_C$ of the intermediate array of LED subpixels. Accordingly, the plurality of electronics layers 202, 203, 204, 205 of the test substrate 200 may be configured to provide an electrical testing circuit for each LED subpixel which can be bonded to the intermediate array of LED subpixels 100. That is to say, when the test substrate is bonded to the intermediate array of LED subpixels 100 the plurality of electronics layers 202, 203, 204, 205 is configured to supply electrical power to each of the LED subpixels 103.

As shown in FIG. 27, a plurality of seventh openings 212 are formed in the test substrate surface 210 which correspond to the arrangement of the anode contact metallisations $A_G$ $A_B$ $A_R$, and the cathode contact metallisation $C_C$ provided on the intermediate array of LED subpixels 100. A plurality of conductive contact portions 208 are then formed within each of the seventh openings 212 of the test substrate 200.

Figure 28:
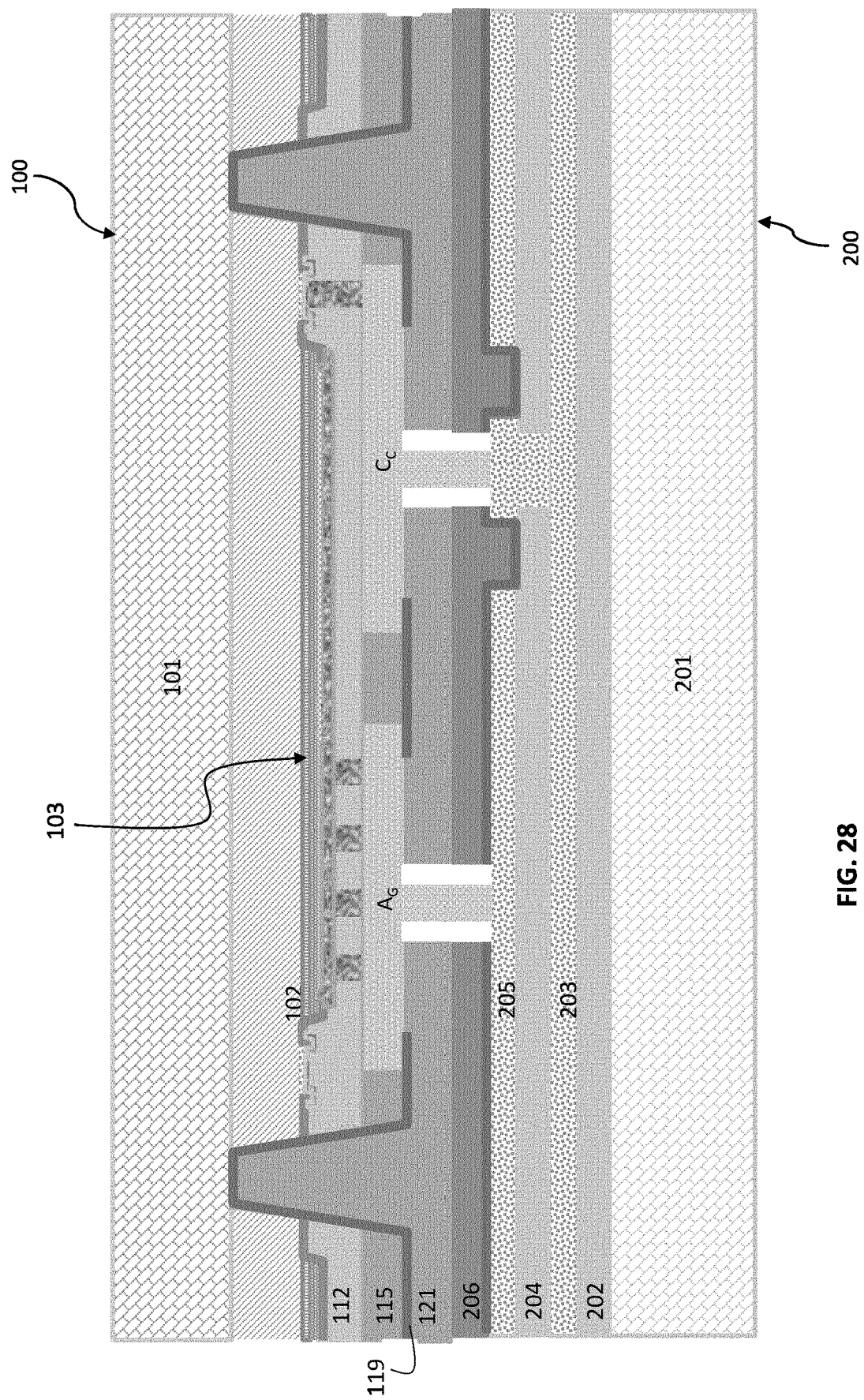
FIG. 28 shows a cross-section of a test substrate step along line B-B' corresponding to the intermediate step of FIG. 14.

As discussed above, the intermediate array of LED subpixels 100 is configured to be bonded to the test substrate 200. A view of the intermediate array of LED subpixels 100 and the test substrate 200 being bonding together along line B-B' is shown in FIG. 28. As such, it will be appreciated from FIG. 28 that the cathode contact layer 109 is electrically connected to the first conductive layer 203 of the test substrate via the cathode contact metallisation $C_C$. The anode contact layer 108 for the LED subpixel G is electrically connected to the second conductive layer 205 of the test substrate through the anode contact metallisation $A_G$.

Figure 29:
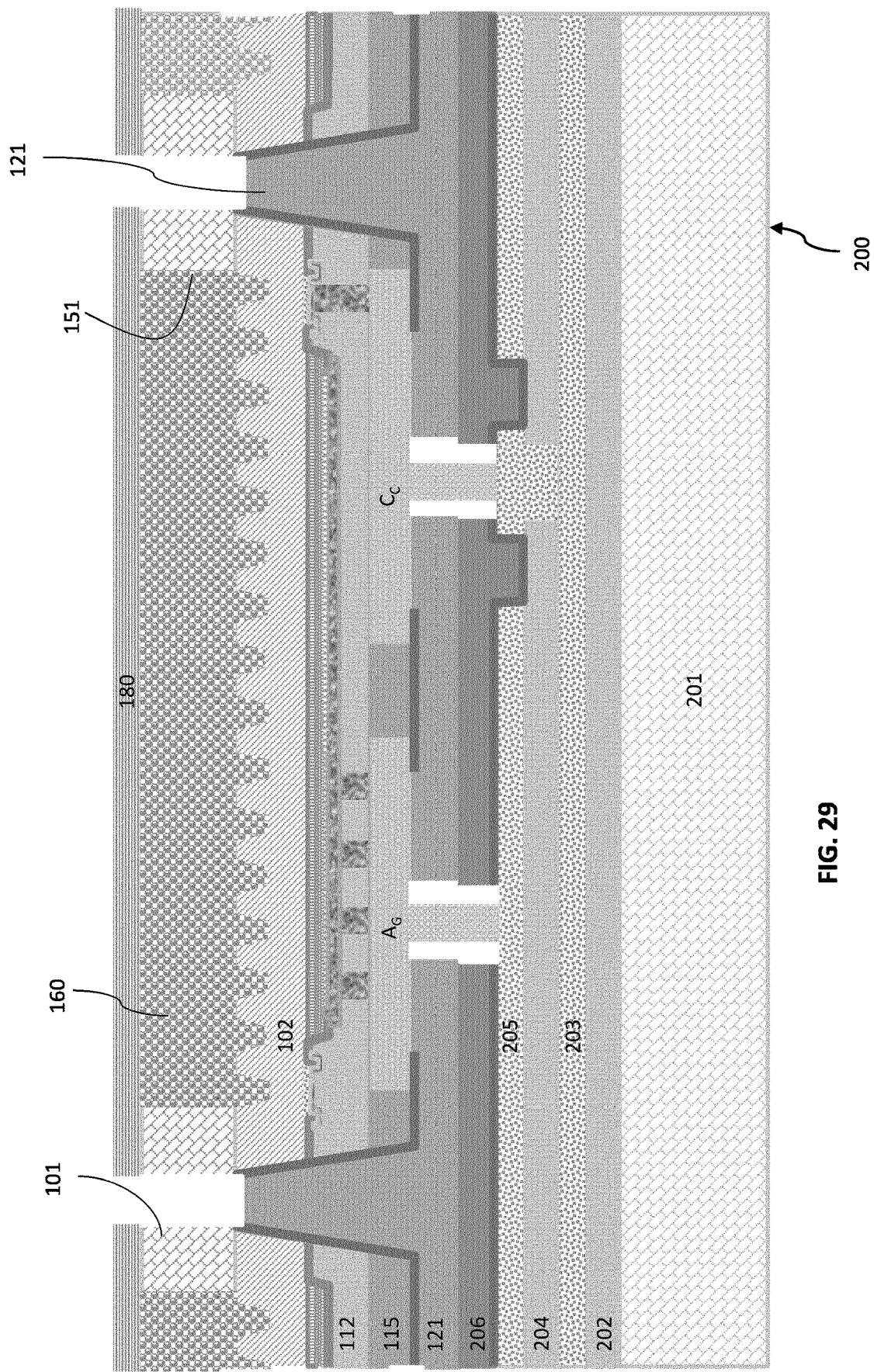
FIG. 29 shows a cross-section of an intermediate step along line B-B' corresponding to the intermediate step of FIG. 17.

Following the bonding of the intermediate array of LED subpixels 100 to the test substrate 200, the light emitting surface 130 of the intermediate array of LED subpixels 100 may be further processed to form light extraction features. For example, as shown in FIG. 29, a container volume 151 is formed in the sacrificial substrate 101. The container volume 151 is filled with a first colour converting material 160 and a pump light reflector 180 is provided over the container volume 151. As such, the structure shown in FIG. 29 is a different view of the structure as shown in FIG. 17.

Figure 30:
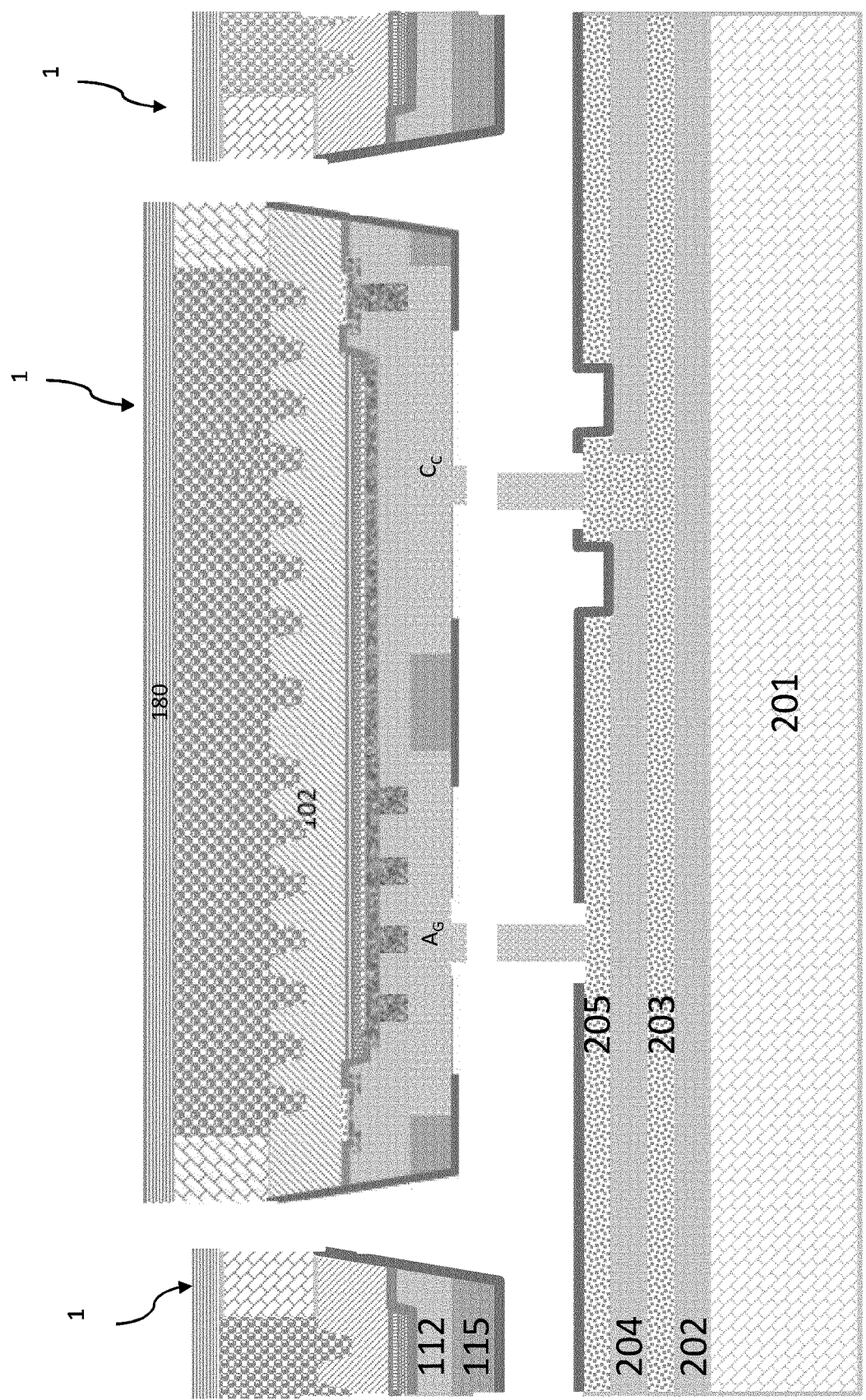
FIG. 30 shows a cross-section of a monolithic LED pixel along line B-B'.

Finally, for example as shown in FIG. 30, each monolithic LED pixel 1 may be removed from the test substrate 200, for example, using a mass transfer pick and place machine.

Prior to the removal of the sacrificial dielectric layer 121 and the freeing of each monolithic LED pixel 1 from the test substrate 200, each LED subpixel may be tested. As part of the test procedure, the first and second conductive layer 203, 205 of the test substrate may be connected to a power source. As such, a voltage may be applied across the first and second conductive layers 203, 205 in order to drive a current through each LED subpixel of the intermediate array of LED subpixels 100. According to the first embodiment, the test procedure is configured to turn on each of the LEDs in the intermediate array of LED subpixels simultaneously. A testing analysis device, for example a camera or other light sensitive sensor, may then detect the light emitted from the LED subpixels of the intermediate array LED subpixels 100. The information recorded by the testing analysis device (e.g. the image recorded by a camera) may then be used by a processor to determine whether or any of the LED subpixels 103 are not operational. Any monolithic LED pixels 1 within the intermediate array 100 which are identified as including one or more non-operational LED subpixels 103 may be identified and not used is any subsequent pick and place process. Accordingly, the test substrate 200 allows the array of monolithic LED pixels 1 to be tested in parallel. Such a parallel testing process is more efficient than testing each monolithic LED pixel 1 after removal from the test substrate 200. Accordingly, the process of parallel testing of each of the monolithic LED pixels 1 may be integrated into the method of fabricating the monolithic LED pixels 1.

Of course, it will be appreciated that the present disclosure is not limited to the above testing procedure. For example, in some embodiments, the test substrate may be configured to test each of the monolithic electronic devices independently. In some embodiments, the testing procedure may involve confirming that an expected amount of current flows through each monolithic electronic device when a predetermined voltage is applied. As such, a testing procedure may be performed at any time following the bonding of the test substrate 200 to the intermediate array of LED subpixels.

As shown in FIG. 30, following the removal of the monolithic LED pixels 1 from the test substrate 200, the testing circuitry of the test substrate 200 is substantially unchanged. Accordingly, the test substrate 200 may be reused for further fabrication processes of monolithic LED pixels 1. In some embodiments, where the test substrate 200 includes a surface for bonding to the intermediate array of LED subpixels 100 from a sacrificial test dielectric layer, the sacrificial test dielectric layer may need to be formed on the test substrate 200 again prior to its reuse.

Accordingly, a monolithic LED pixel 1 according to a first embodiment of the disclosure is provided. In some embodiments, each of the monolithic LED pixels may be a monolithic micro LED pixel. As such, each of the LED subpixels may be a micro LED subpixel which has a size of no greater than 100 μm×100 μm. In some embodiments, the surface area of each LED subpixel on the common semiconducting layer may define an area of no greater than 100 μm×100 μm. In some embodiments, the surface area of each LED subpixel on the common semiconducting layer may define an area of no greater than: 50 μm×50 μm, 30 μm×30 μm, 20 μm×20 μm, or 10 μm×10 μm.

Although a preferred embodiment of the invention has been described herein in detail, it will be understood by those that are skilled in the art that variations may be made thereto without departing from the scope of the invention or the appended claims.

The invention claimed is:

1. A method of forming and testing a plurality of monolithic electronic devices, the method comprising:
    a) forming a monolithic electronic device array comprising:
    forming a common semiconducting layer comprising a Group III-nitride on a sacrificial substrate;
    forming an array of monolithic electronic devices on a surface of the common semiconducting layer on an opposite side of the common semiconducting layer to the sacrificial substrate, each monolithic electronic device of the array of monolithic electronic devices comprising a plurality of Group III-nitride layers;
    forming a planarising dielectric layer over the array of monolithic electronic devices to provide a planarised dielectric surface which is generally aligned with the surface of the common semiconducting layer;
    forming a grid of trenches by etching the planarising dielectric layer and the common semiconducting layer from the planarised dielectric surface through to the sacrificial substrate, wherein the grid of trenches surrounds each monolithic electronic device;
    forming first electrical contacts to each monolithic electronic device through the planarising dielectric layer,
    forming a sacrificial dielectric layer over the grid of trenches and the planarised dielectric surface of the planarising dielectric layer to form a first bonding surface generally aligned with the surface of the common semiconducting layer, wherein the first bonding surface comprises first apertures aligned with each of the first electrical contacts;
    b) providing a test substrate comprising:
    an electronics substrate comprising electronics testing circuitry configured to supply power to each of the monolithic electronic devices of the monolithic electronic device array;
    and
    a plurality of second electrical contacts arranged on the electronics substrate to correspond to an arrangement of the first electrical contacts of the monolithic electronic device array;
    wherein a bonding dielectric layer is formed on the electronics substrate to provide a second bonding surface, the second bonding surface comprising second apertures aligned with each of the second electrical contacts;
    c) aligning the second electrical contacts of the test substrate with the first electrical contacts of the monolithic electronic device array and bonding the second bonding surface of the test substrate to the first bonding surface of the sacrificial dielectric layer such that the first and second electrical contacts are in electrical contact;
    d) supplying power from the test substrate to the monolithic electronic device array to test each of the monolithic electronic devices of the monolithic electronic device array via the plurality of first and second electrical contacts; and
    e) selectively removing first portions of the sacrificial substrate through a thickness of the sacrificial substrate to separate each of the monolithic electronic devices; and
    removing the sacrificial dielectric layer to separate each monolithic electronic device from the test substrate.

2. A method according to claim 1, wherein
the bonding dielectric layer is a sacrificial bonding dielectric layer, wherein the sacrificial bonding dielectric layer is configured to be selectively removed with the sacrificial dielectric layer to separate each monolithic electronic device from the test substrate.

3. A method according to claim 1, wherein,
following the removal of the sacrificial dielectric layer to separate each monolithic electronic device from the test substrate, the test substrate is reusable in a method of forming and testing a plurality of monolithic devices.

4. A method according to claim 1, wherein
the electronics testing circuitry of the test substrate is configured to supply power to each of the monolithic electronic devices in parallel.

5. A method according to claim 1, wherein
each monolithic electronic device of the monolithic electronic device array comprises a light emitting diode (LED).

6. A method according to claim 1, wherein
each monolithic electronic device is a monolithic light emitting diode (LED) pixel comprising a plurality of LED subpixels on the surface of the common semiconducting layer, each LED subpixel comprising a stack of Group III-nitride layers.

7. A method according to claim 6, wherein, following bonding of the test substrate the monolithic electronic device array, the method comprises:
    forming light extraction features for each of the monolithic LED pixels comprising: selectively removing second portions of the sacrificial substrate aligned with each of the LED subpixels.

8. A method according to claim 7, wherein
forming light extraction features for each of the monolithic LED pixels comprises:
selectively removing second portions of the sacrificial substrate aligned with each of the LED subpixels to form a container volume for each LED subpixel; and
providing a first colour converting layer in at least one of the container volumes of each monolithic LED pixel, the first colour converting layer configured to absorb light of a first wavelength and emit converted light of a first converted light wavelength longer than the first wavelength.

9. A method according to claim 8, wherein
the first converted light wavelength is at least 500 nm and/or no greater than 650 nm.

10. A method according to claim 8, wherein
a second colour converting layer is provided in in at least one other of the container volumes of each monolithic LED pixel, the second colour converting layer configured to absorb light of a first wavelength and emit converted light of a second converted light wavelength longer than the first converted light wavelength.

11. A method according to claim 6, wherein
each LED subpixel is configured to generate light having a first wavelength of at least 380 nm and/or no greater than 490 nm.

12. A method according to claim 6, wherein
the surface area of each LED subpixel on the common semiconducting layer may define an area of no greater than 100 μm×100 μm.

13. A monolithic device array for bonding a test substrate, comprising:
a sacrificial substrate;
a common semiconducting layer comprising a Group III-nitride provided on the sacrificial substrate;
an array of monolithic electronic devices provided on a surface of the common semiconducting layer on an opposite side of the common semiconducting layer to the sacrificial substrate, each monolithic electronic device of the array of monolithic electronic devices comprising a plurality of Group III-nitride layers;
a planarising dielectric layer provided on the array of monolithic electronic devices to provide a planarised dielectric surface which is aligned with the surface of the common semiconducting layer, wherein
the planarising dialectic layer defines a grid of trenches extending from the planarised dielectric surface through to the sacrificial substrate, wherein the grid of trenches surrounds each monolithic electronic device;
first electrical contacts for each monolithic electronic device, the first electrical contacts extending from each monolithic electronic device to the planarised dielectric surface; and
a sacrificial dielectric layer provided within the grid of trenches and over the planarised dielectric surface of the planarising dielectric layer to provide a first bonding surface generally aligned with the surface of the common semiconducting layer, wherein the first bonding surface comprises first apertures aligned with each of the first electrical contacts.

14. A monolithic device array according to claim 13, wherein
each monolithic electronic device of the monolithic electronic device array comprises a light emitting diode (LED).

15. A monolithic device array according to claim 13, wherein
each monolithic electronic device is a monolithic light emitting diode (LED) pixel comprising a plurality of LED subpixels on the surface of the common semiconducting layer, each LED subpixel comprising a stack of Group III-nitride layers.

16. A monolithic device array according to claim 13, wherein the test substrate comprises:
an electronics substrate comprising electronics testing circuitry configured to supply power to each of the monolithic electronic devices of the monolithic electronic device array;
a plurality of second electrical contacts arranged on the electronics substrate to correspond to an arrangement of the first electrical contacts of the monolithic electronic device array; and
a bonding dielectric layer is formed on the electronics substrate to provide a second bonding surface, the second bonding surface comprising second apertures aligned with each of the second electrical contacts.

17. A monolithic device array according to claim 16, wherein
the bonding dielectric layer is a sacrificial bonding dielectric layer, wherein the sacrificial bonding dielectric layer is configured to be selectively removed with the sacrificial dielectric layer to separate each monolithic electronic device from the test substrate.

18. A monolithic device array according to claim 17, wherein
the sacrificial bonding dielectric layer is configured to be selectively removed such that the test substrate is reusable for bonding to the monolithic electronic device array.

19. A monolithic device array according to claim 16, further comprising:
an etch stop layer provided between the bonding dielectric layer and the electronics substrate.

20. A monolithic device array according to claim 16, wherein
the electronics testing circuitry of the test substrate is configured to supply power to each of the monolithic electronic devices in parallel.

* * * * *